United States Patent
Kim et al.

(10) Patent No.: US 12,093,569 B2
(45) Date of Patent: Sep. 17, 2024

(54) MEMORY DEVICE, HOST DEVICE AND METHOD OF OPERATING THE MEMORY DEVICE

(71) Applicant: SAMSUNG ELECTRONICS CO., LTD., Suwon-si (KR)

(72) Inventors: Joo Hwan Kim, Seoul (KR); Su Cheol Lee, Suwon-si (KR); Jin Do Byun, Suwon-si (KR); Eun Seok Shin, Seoul (KR); Young Don Choi, Seoul (KR); Jung Hwan Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 149 days.

(21) Appl. No.: 17/810,929

(22) Filed: Jul. 6, 2022

(65) Prior Publication Data
US 2023/0138845 A1    May 4, 2023

(30) Foreign Application Priority Data

Nov. 4, 2021    (KR) .................. 10-2021-0150385

(51) Int. Cl.
*G11C 7/10* (2006.01)
*G06F 3/06* (2006.01)
*G11C 11/4096* (2006.01)

(52) U.S. Cl.
CPC ............ *G06F 3/0659* (2013.01); *G06F 3/061* (2013.01); *G06F 3/0673* (2013.01);
(Continued)

(58) Field of Classification Search
CPC ...... G06F 3/0659; G06F 3/061; G06F 3/0673; G06F 3/0658; G11C 7/1057;
(Continued)

(56) References Cited

U.S. PATENT DOCUMENTS 7,734,188 B2    6/2010  Kuwata et al.
10,135,427 B2   11/2018 Zerbe et al.
(Continued)

FOREIGN PATENT DOCUMENTS

KR    10-2021-0033051    3/2021

OTHER PUBLICATIONS

1st Office Action dated Jan. 23, 2023 in corresponding European Application No. EP 22 184 408.7.
(Continued)

*Primary Examiner* — Xiaochun L Chen
(74) *Attorney, Agent, or Firm* — F. Chau & Associates, LLC

(57) ABSTRACT

A memory device, a host device and a method of operating the memory device are provided. The memory device includes a data signal generator configured to provide a data signal to a transmission driver, the transmission driver configured to output a multi-level signal having any one of first to third signal levels based on the data signal, a command decoder configured to receive a feedback signal from outside of the memory device and decode the feedback signal, a data signal controller configured to adjust the data signal based on a decoding result of the command decoder, and a drive strength controller configured to adjust at least one of the first to third signal levels based on the decoding result of the command decoder.

18 Claims, 31 Drawing Sheets

(52) U.S. Cl.
CPC .......... *G11C 7/1057* (2013.01); *G11C 7/1066* (2013.01); *G11C 7/1084* (2013.01); *G11C 7/1093* (2013.01); *G11C 11/4096* (2013.01)

(58) Field of Classification Search
CPC ... G11C 7/1066; G11C 7/1084; G11C 7/1093; G11C 11/4096; G11C 2207/101; G11C 7/22; G11C 7/12; G11C 11/4072; G11C 7/1096; H03K 19/0005
See application file for complete search history.

(56) References Cited

U.S. PATENT DOCUMENTS

| | | |
|---|---|---|
| 10,411,923 B2 | 9/2019 | Stojanovic et al. |
| 10,990,475 B2 | 4/2021 | Liikanen et al. |
| 10,997,095 B2 | 5/2021 | Mayer et al. |
| 2015/0066819 A1* | 3/2015 | Mozak ................. G11C 29/028 706/12 |
| 2018/0131374 A1 | 5/2018 | Choi |
| 2020/0066309 A1* | 2/2020 | Mayer ................. G11C 29/028 |
| 2021/0091980 A1 | 3/2021 | Farzan et al. |
| 2021/0343325 A1* | 11/2021 | Moon ................. G11C 11/4076 |
| 2022/0310155 A1* | 9/2022 | Xu ..................... G11C 11/4096 |

OTHER PUBLICATIONS

European Search Report Sep. 1, 2023 in corresponding European Application No. EP 22 184 408.7.

\* cited by examiner

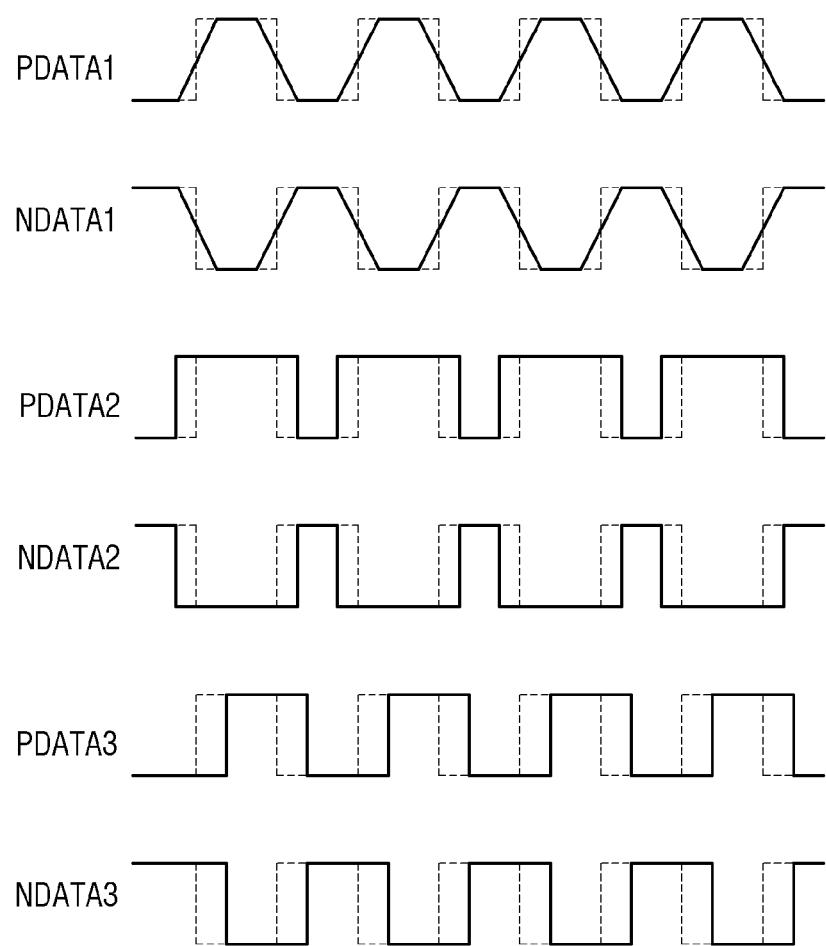

| Data State | P1 | P2 | P3 | N1 | N2 | N3 | Data Level |
|---|---|---|---|---|---|---|---|
| 11 | ON | ON | ON | OFF | OFF | OFF | 3/6×VDD |
| 10 | OFF | ON | ON | OFF | OFF | ON | 2/6×VDD |
| 01 | OFF | OFF | ON | OFF | ON | ON | 1/6×VDD |
| 00 | OFF | OFF | OFF | ON | ON | ON | 0×VDD |

FIG. 22C

| Data State | P1  | P2  | P3  | N1  | N2  | N3  | Data Level |
|---|---|---|---|---|---|---|---|
| 11 | ON  | ON  | ON  | OFF | OFF | OFF | 6/6×VDD |
| 10 | OFF | ON  | ON  | OFF | OFF | ON  | 5/6×VDD |
| 01 | OFF | OFF | ON  | OFF | ON  | ON  | 4/6×VDD |
| 00 | OFF | OFF | OFF | ON  | ON  | ON  | 3/6×VDD |

MEMORY DEVICE, HOST DEVICE AND METHOD OF OPERATING THE MEMORY DEVICE

CROSS-REFERENCE TO RELATED APPLICATION

This application claims priority under 35 U.S.C. § 119 to Korean Patent Application No. 10-2021-0150385, filed on Nov. 4, 2021 in the Korean Intellectual Property Office, the disclosure of which is incorporated by reference herein in its entirety.

TECHNICAL FIELD

Embodiments of the present disclosure relate to a memory device, a host device and a method of operating the memory device.

DISCUSSION OF RELATED ART

In general, in a multi-level signal system of pulse amplitude modulation (PAM)-N (N is a natural number greater than or equal to 3), to secure the linearity between N data levels, a multi-level signal is transmitted so that the signal level interval of an output signal is constant at a transmitter.

However, depending on the operating characteristics of a receiver, or the environment of a signal transmission/reception system such as a link system (e.g., an environment in which data encoding is applied), the sensing margin of the receiver may be different for each signal level (or data level).

The difference in the sensing margin for each signal level may be because a timing skew exists between the signal transmitted from the transmitter and the signal received at the receiver, which may reduce the communication reliability between the transmitter and the receiver.

SUMMARY

Embodiments of the present disclosure provide a memory device capable of reliable signal communication.

Embodiments of the present disclosure also provide a host device capable of reliable signal communication.

Embodiments of the present disclosure also provide a method of operating the memory device capable of reliable signal communication.

According to embodiments of the present disclosure, a memory device includes a data signal generator configured to provide a data signal to a transmission driver, the transmission driver configured to output a multi-level signal having any one of first to third signal levels based on the data signal, a command decoder configured to receive a feedback signal from outside of the memory device and decode the feedback signal, a data signal controller configured to adjust the data signal based on a decoding result of the command decoder, and a drive strength controller configured to adjust at least one of the first to third signal levels based on the decoding result of the command decoder.

According to embodiments of the present disclosure, a memory device includes a transmission driver configured to output a first multi-level signal having any one of first to fourth signal levels based on a data signal, and a controller configured to receive a feedback signal from outside of the memory device and control the transmission driver to output a second multi-level signal different from the first multi-level signal based on the feedback signal. The controller adjusts the data signal, and controls the transmission driver to output the second multi-level signal by adjusting at least one of the first to fourth signal levels.

According to embodiments of the present disclosure, a host device includes a reception driver configured to receive a first multi-level signal generated based on a first data signal and having any one of first to third signal levels, and a signal controller configured to check the first multi-level signal received by the reception driver, and generate and output a feedback signal including a first command instructing adjustment of the first data signal and a second command instructing adjustment of at least one of the first to third signal levels.

BRIEF DESCRIPTION OF THE DRAWINGS

The above and other features of the present disclosure will become more apparent by describing in detail embodiments thereof with reference to the accompanying drawings, in which:

FIGS. 8 to 10 and 11A to 11C are diagrams for describing an operation of a data signal controller of FIG. 7 according to embodiments of the present disclosure;

FIGS. 22B and 22C are diagrams for describing an operation of the transmission driver of FIG. 22A according to embodiments of the present disclosure;

DETAILED DESCRIPTION OF THE EMBODIMENTS

Figure 1:
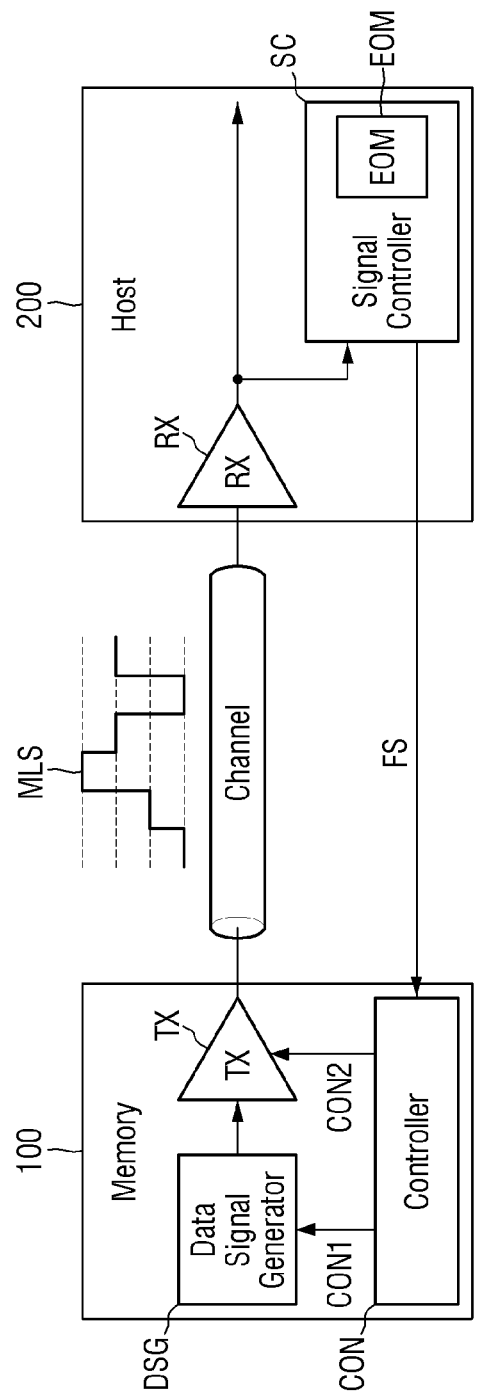
FIG. 1 shows a memory system according to embodiments of the present disclosure.

Embodiments of the present disclosure will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

FIG. 1 shows a memory system according to embodiments of the present disclosure.

Referring to FIG. 1, a memory system includes a memory device 100 and a host device 200.

The memory device 100 may include storage media for storing data according to a request from the host device 200. In some embodiments, the memory device 100 may include a dynamic random memory (DRAM).

However, embodiments are not limited thereto. For example, in some embodiments, the memory device 100 may include at least one of a solid state drive (SSD), an embedded memory, or a removable external memory. When the memory device 100 is an SSD, the memory device 100 may be a device conforming to the non-volatile memory express (NVMe) standard. When the memory device 100 is an embedded memory or an external memory, the memory device 100 may be a device conforming to the universal flash storage (UFS) standard or the embedded multi-media card (eMMC) standard. The host device 200 and the memory device 100 may each generate and transmit a packet conforming to an adopted standard protocol.

When the memory device 100 includes a flash memory, the flash memory may include a 2D NAND memory array or a 3D (or vertical) NAND (VNAND) memory array. In some embodiments, the memory device 100 may also include various other types of non-volatile memories. For example, the memory device 100 may include a magnetic RAM (MRAM), a spin-transfer torque MRAM, a conductive bridging RAM (CBRAM), a ferroelectric RAM (Fe-RAM), a phase RAM (PRAM), a resistive RAM, and various other types of memories.

The memory device 100 may include a data signal generator DSG (also referred to as a data signal generator circuit), a transmission driver TX (also referred to as a transmission driver circuit), and a controller CON (also referred to as a controller circuit). The memory device 100 may further include additional components for storing data according to a request from the host device 200.

The data signal generator DSG may provide a data signal to the transmission driver TX. A detailed description of the data signal generated by the data signal generator DSG is provided below.

The transmission driver TX may output a multi-level signal MLS to a channel based on the data signal generated by the data signal generator DSG. In the present disclosure, the multi-level signal MLS refers to a signal having any one of at least three signal levels.

For example, when the memory system performs communication using PAM-3, the multi-level signal MLS is transmitted to have any one of first to third signal levels. Further, when the memory system performs communication using PAM-4, the multi-level signal MLS is transmitted to have any one of first to fourth signal levels.

For example, when the memory system performs communication using PAM-N (N is a natural number equal to or greater than 3), the multi-level signal MLS is transmitted to have any one of first to $N^{th}$ signal levels.

Hereinafter, for example, embodiments of the present disclosure in which the memory system performs communication using PAM-4 will be described. However, their is to be understood that embodiments of the present disclosure are not limited to the following examples.

Figure 2:
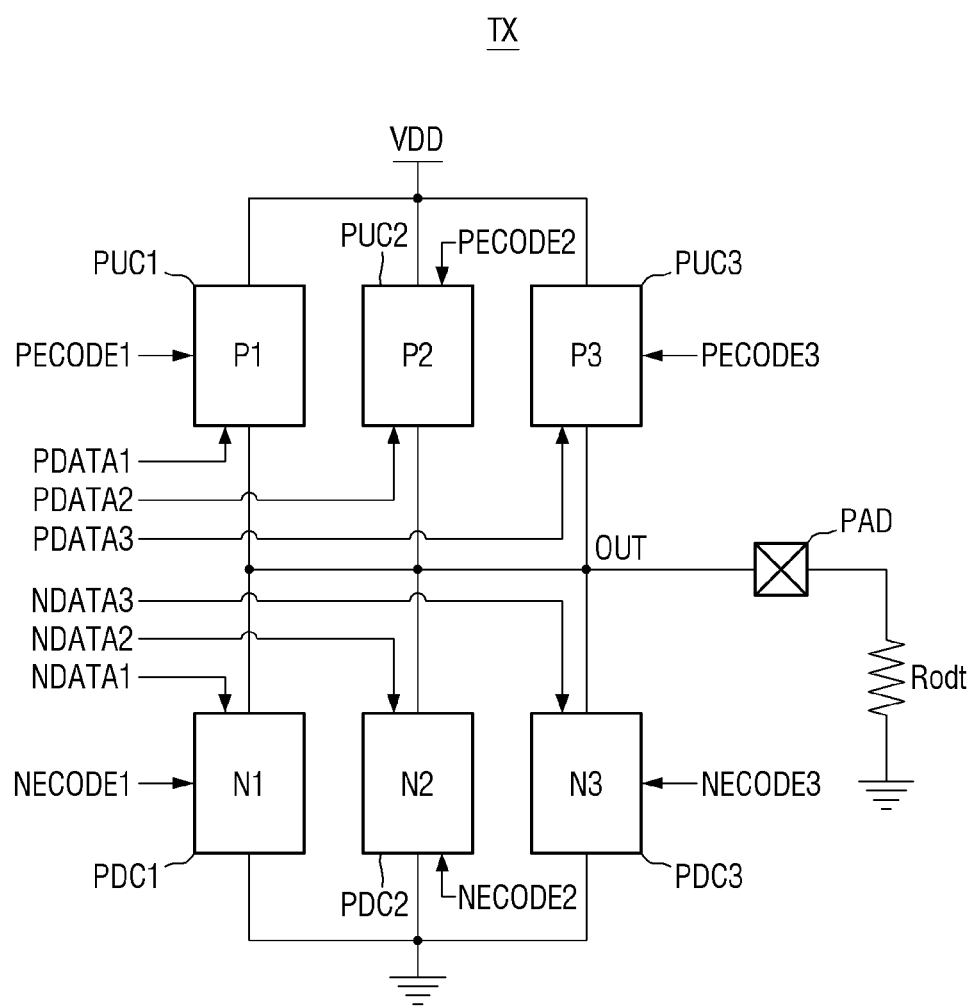
FIG. 2 is a diagram illustrating a transmission driver of FIG. 1 according to embodiments of the present disclosure.
Figure 3:
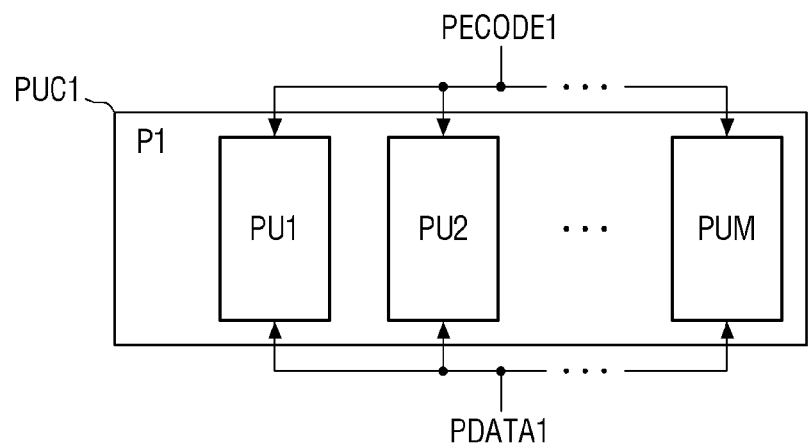
FIG. 3 is a diagram illustrating a pull-up circuit of FIG. 2 according to embodiments of the present disclosure.
Figure 5:
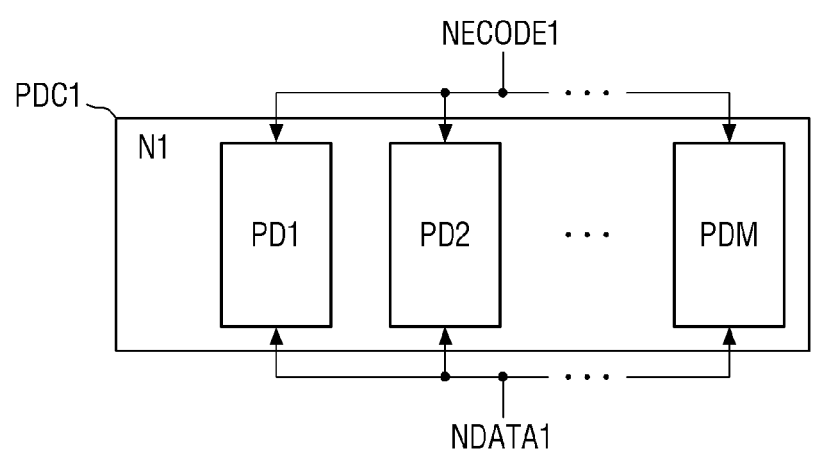
FIG. 5 is a diagram illustrating a pull-down circuit of FIG. 2 according to embodiments of the present disclosure.
Figure 6A:
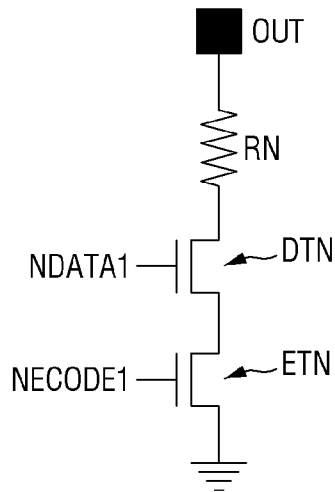
FIGS. 6A and 6B are diagrams illustrating a pull-down unit of FIG. 5 according to embodiments of the present disclosure.
Figure 6B:
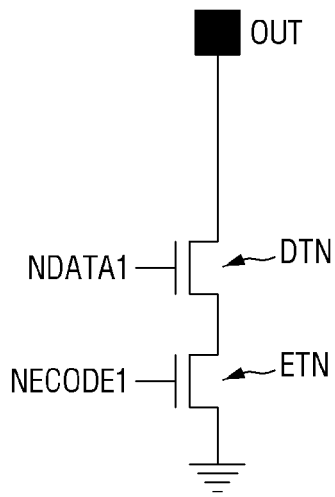

FIG. 2 is a diagram illustrating a transmission driver of FIG. 1 according to embodiments of the present disclosure. FIG. 3 is a diagram illustrating a pull-up circuit of FIG. 2 according to embodiments of the present disclosure. FIGS. 4A to 4D are diagrams illustrating a pull-up unit of FIG. 3 according to embodiments of the present disclosure. FIG. 5 is a diagram illustrating a pull-down circuit of FIG. 2 according to embodiments of the present disclosure. FIGS. 6A and 6B are diagrams illustrating a pull-down unit of FIG. 5 according to embodiments of the present disclosure.

Referring to FIG. 2, the transmission driver TX may include pull-up circuits PUC1, PUC2, and PUC3 and pull-down circuits PDC1, PDC2, and PDC3.

The data signal generator DSG of FIG. 1 may generate pull-up data signals PDATA1 to PDATA3 according to data intended to be transmitted by the transmission driver TX. In some embodiments, for 2-bit data intended to be transmitted by the transmission driver TX, the data signal generator DSG of FIG. 1 may generate a 1-bit pull-up data signal PDATA1, a 1-bit pull-up data signal PDATA2, and a 1-bit pull-up data signal PDATA3. However, embodiment of the present disclosure are not limited thereto.

The pull-up data signal PDATA1 may determine whether the pull-up circuit PUC1 is turned on, the pull-up data signal PDATA2 may determine whether the pull-up circuit PUC2 is turned on, and the pull-up data signal PDATA3 may determine whether the pull-up circuit PUC3 is turned on.

A pull-up enable code PECODE1 may be provided to the pull-up circuit PUC1. The pull-up enable code PECODE1 may determine the number of pull-up units enabled in the pull-up circuit PUC1. Each pull-up unit may include, for example, at least one switch, and may also be referred to as a pull-up circuit. A pull-up enable code PECODE2 may be provided to the pull-up circuit PUC2. The pull-up enable code PECODE2 may determine the number of pull-up units enabled in the pull-up circuit PUC2. A pull-up enable code PECODE3 may be provided to the pull-up circuit PUC3. The pull-up enable code PECODE3 may determine the number of pull-up units enabled in the pull-up circuit PUC3.

In an embodiment, the pull-up data signals PDATA1 to PDATA3 may be signals independent of each other, and the pull-up enable codes PECODE1, PECODE2, and PECODE3 may be codes independent of each other. Accordingly, the pull-up circuits PUC1, PUC2, and PUC3 may be turned on or turned off independently of each other, and the number of pull-up units enabled in each of the pull-up circuits PUC1, PUC2, and PUC3 may be independent.

Referring to FIG. 3, the pull-up circuit PUC1 may include a plurality of pull-up units PU1 to PUM that are enabled based on the pull-up enable code PECODE1. In some embodiments, the pull-up circuit PUC2 and the pull-up circuit PUC3 may also have the same configuration.

The number of pull-up units PU1 to PUM included in the pull-up circuit PUC1 may be related to the number of bits of the pull-up enable code PECODE1. For example, when the number of bits of the pull-up enable code PECODE1 is 5 bits, the pull-up circuit PUC1 may include 31 pull-up units PU1 to PUM (e.g., M=31).

The pull-up enable code PECODE1 may determine the number of pull-up units PU1 to PUM enabled among the pull-up units PU1 to PUM included in the pull-up circuit PUC1.

Figure 4A:
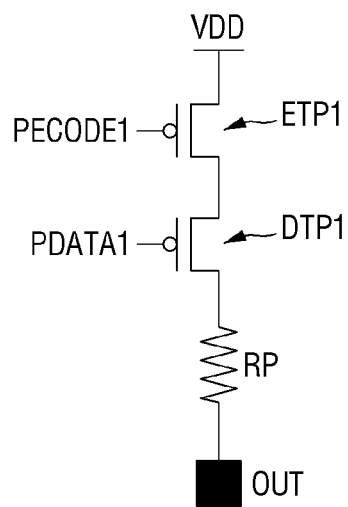
FIGS. 4A to 4D are diagrams illustrating a pull-up unit of FIG. 3 according to embodiments of the present disclosure.

For example, when the pull-up unit is configured with a PMOS transistor as illustrated in FIG. 4A, and the pull-up enable code PECODE1 is 5 bits having a value of 11111, the 31 pull-up units PU1 to PUM included in the pull-up circuit PUC1 may all be disabled.

For example, when the pull-up unit is configured with a PMOS transistor as illustrated in FIG. 4A, and the pull-up enable code PECODE1 is 5 bits having a value of 11110, one pull-up unit (e.g., PU1) among 31 pull-up units PU1 to PUM included in the pull-up circuit PUC1 may be enabled, and the other pull-up units PU2 to PUM may be disabled.

For example, when the pull-up unit is configured with a PMOS transistor as illustrated in FIG. 4A, and the pull-up enable code PECODE1 is 5 bits having a value of 00000, the 31 pull-up units PU1 to PUM included in the pull-up circuit PUC1 may all be enabled.

As described above, since the pull-up enable codes PECODE1, PECODE2, and PECODE3 are codes independent of each other, the number of pull-up units PU1 to PUM enabled in each of the pull-up circuits PUC1, PUC2, and PUC3 may be independent.

For example, when the pull-up enable codes PECODE1, PECODE2, and PECODE3 are each 5 bits and their values are different from each other, the number of pull-up units PU1 to PUM enabled in the pull-up circuit PUC1, the number of pull-up units PU1 to PUM enabled in the pull-up circuit PUC2, and the number of pull-up units PU1 to PUM enabled in the pull-up circuit PUC3 may be different from each other.

Referring to FIG. 4A, the pull-up unit PU1 may include a pull-up enable transistor ETP1 configured as a PMOS transistor, a pull-up data transistor DTP1 configured as a PMOS transistor, and a pull-up resistor RP.

The pull-up enable transistor ETP1 may be turned on based on the pull-up enable code PECODE1, and the pull-up data transistor DTP1 may be turned on based on the pull-up data signal PDATA1.

Figure 4B:
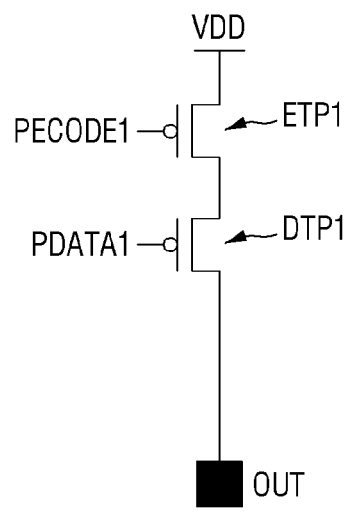

In some embodiments, the pull-up unit PU1 may also be implemented by omitting the pull-up resistor RP as illustrated in FIG. 4B. In addition, although only the structure of the pull-up unit PU1 is illustrated in the drawing, it is to be understood that the other pull-up units PU2 to PUM that are not illustrated may also have the same structure.

Figure 4C:
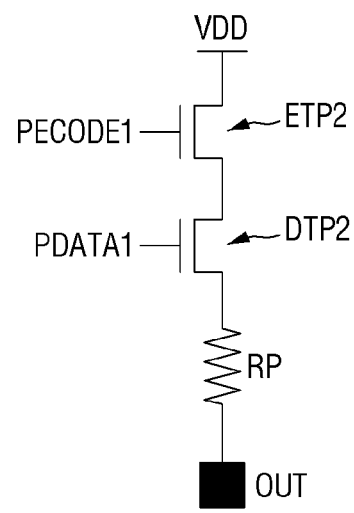

Referring to FIG. 4C, the pull-up unit PU1 may include a pull-up enable transistor ETP2 configured as an NMOS transistor, a pull-up data transistor DTP2 configured as an NMOS transistor, and the pull-up resistor RP. The pull-up enable transistor ETP1 may be turned on based on the pull-up enable code PECODE1, and the pull-up data transistor DTP1 may be turned on based on the pull-up data signal PDATA1. Although only the structure of the pull-up unit PU1 is illustrated in the drawing, it is to be understood that the other pull-up units PU2 to PUM that are not illustrated may also have the same structure.

As such, when the pull-up enable transistor ETP2 and the pull-up data transistor DTP2 are configured as NMOS transistors, for example, when the pull-up enable code PECODE1 is 5 bits having a value of 00000, the 31 pull-up units PU1 to PUM included in the pull-up circuit PUC1 may all be disabled. Further, for example, when the pull-up enable code PECODE1 is 5 bits having a value of 11111, the 31 pull-up units PU1 to PUM included in the pull-up circuit PUC1 may all be enabled.

Figure 4D:
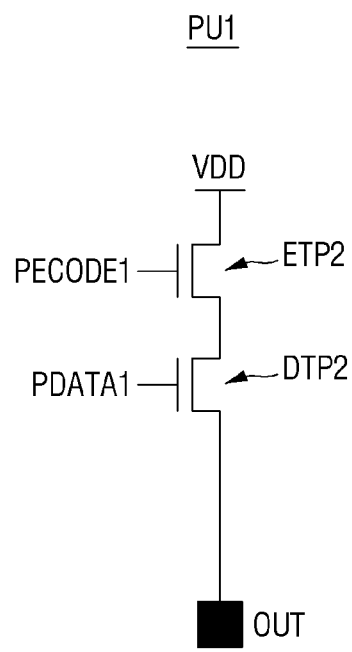

In some embodiments, the pull-up unit PU1 may be implemented by omitting the pull-up resistor RP as illustrated in FIG. 4D.

Referring back to FIG. 2, the data signal generator DSG of FIG. 1 may generate pull-down data signals NDATA1 to NDATA3 according to data intended to be transmitted by the transmission driver TX. In some embodiments, for 2-bit data intended to be transmitted by the transmission driver TX, the data signal generator DSG of FIG. 1 may generate a 1-bit pull-down data signal NDATA1, a 1-bit pull-down data signal NDATA2, and a 1-bit pull-down data signal NDATA3. However, embodiment of the present disclosure are not limited thereto.

The pull-down data signal NDATA1 may determine whether the pull-down circuit PDC1 is turned on, the pull-down data signal NDATA2 may determine whether the pull-down circuit PDC2 is turned on, and the pull-down data signal NDATA3 may determine whether the pull-down circuit PDC3 is turned on.

The pull-down enable code NECODE1 may be provided to the pull-down circuit PDC1. The pull-down enable code NECODE1 may determine the number of pull-down units enabled in the pull-down circuit PDC1. The pull-down enable code NECODE2 may be provided to the pull-down circuit PDC2. The pull-down enable code NECODE2 may determine the number of pull-down units enabled in the pull-down circuit PDC2. The pull-down enable code NECODE3 may be provided to the pull-down circuit PDC3. The pull-down enable code NECODE3 may determine the number of pull-down units enabled in the pull-down circuit PDC3.

In an embodiment, the pull-down data signals NDATA1 to NDATA3 may be signals independent of each other, and the pull-down enable codes NECODE1, NECODE2, and NECODE3 may be codes independent of each other. Accordingly, the pull-down circuits PDC1, PDC2, and PDC3 are turned on or off independently of each other, and the number of pull-down units enabled in each of the pull-down circuits PDC1, PDC2, and PDC3 may be independent.

Referring to FIG. 5, the pull-down circuit PDC1 may include a plurality of pull-down units PD1 to PDM that are enabled based on the pull-down enable code NECODE1. In some embodiments, the pull-down circuit PDC2 and the pull-down circuit PDC3 may also have the same configuration.

The number of pull-down units PD1 to PDM included in the pull-down circuit PDC1 may be related to the number of bits of the pull-down enable code NECODE1. For example, when the number of bits of the pull-down enable code NECODE1 is 5 bits, the pull-down circuit PDC1 may include 31 pull-down units PD1 to PDM (e.g., M=31).

In some embodiments, the number of pull-up units included in the pull-up circuits PUC1, PUC2, and PUC3 may be the same as the number of pull-down units included in the pull-down circuits PDC1, PDC2, and PDC3.

The pull-down enable code NECODE1 may determine the number of pull-down units PD1 to PDM enabled among the pull-down units PD1 to PDM included in the pull-down circuit PDC1.

For example, when the pull-down unit is configured with an NMOS transistor as illustrated in FIG. 6A, and the pull-down enable code NECODE1 is 5 bits having a value of 00000, the 31 pull-down units PD1 to PDM included in the pull-down circuit PDC1 may all be disabled.

For example, when the pull-down unit is configured with an NMOS transistor as illustrated in FIG. 6A, and the pull-down enable code NECODE1 is 5 bits having a value of 00010, two pull-down units (e.g., PD1 and PD2) among 31 pull-down units PD1 to PDM included in the pull-down circuit PDC1 may be enabled, and the remaining pull-down units PD3 to PDM may be disabled.

For example, when the pull-down unit is configured with an NMOS transistor as illustrated in FIG. 6A, and the pull-down enable code NECODE1 is 5 bits having a value of 11111, the 31 pull-down units PD1 to PDM included in the pull-down circuit PDC1 may all be enabled.

As described above, since the pull-down enable codes NECODE1, NECODE2, and NECODE3 are codes independent of each other, the number of pull-down units PD1 to PDM enabled in each of the pull-down circuits PDC1, PDC2, and PDC3 may be independent.

For example, when the pull-down enable codes NECODE1, NECODE2, and NECODE3 are each 5 bits and their values are different from each other, the number of pull-down units PD1 to PDM enabled in the pull-down circuit PDC1, the number of pull-down units PD1 to PDM enabled in the pull-down circuit PDC2, and the number of pull-down units PD1 to PDM enabled in the pull-down circuit PDC3 may be different from each other.

Referring to FIG. 6A, the pull-down unit PD1 may include a pull-down enable transistor ETN, a pull-down data transistor DTN, and a pull-down resistor RN.

Although only the structure of the pull-down unit PD1 is illustrated in the drawing, it is to be understood that the other pull-down units PD2 to PDM that are not illustrated may also have the same structure.

The pull-down enable transistor ETN may be turned on based on the pull-down enable code NECODE1, and the pull-down data transistor DTN may be turned on based on the pull-down data signal NDATA1.

In some embodiments, the pull-down unit PD1 may be implemented by omitting the pull-down resistor RN as illustrated in FIG. 6B.

Referring to FIG. 2, as an on-resistance Ron of the pull-up circuits PUC1, PUC2, and PUC3 and the pull-down circuits PDC1, PDC2, and PDC3 is adjusted, the voltage distributed from the power voltage VDD may be applied to an output node OUT, and the voltage may be outputted to an output pad PAD to output a multi-level signal from the transmission driver TX. In some embodiments, the on-resistances of the pull-up circuits PUC1, PUC2, and PUC3 and the pull-down circuits PDC1, PDC2, and PDC3 may be adjusted to match impedance with an on die termination (ODT) resistor Rodt.

An operation in which the on-resistance of the pull-up circuits PUC1, PUC2, and PUC3 and the pull-down circuits PDC1, PDC2, and PDC3 is adjusted and the transmission driver TX outputs a multi-level signal will be described in detail below.

Referring back to FIG. 1, the host device 200 may include a reception driver RX and a signal controller SC. In some embodiments, the host device 200 may include additional components not illustrated.

In some embodiments, the host device 200 may be an application processor or any one of a plurality of modules included in the application processor, and the application processor may be implemented as a system-on-chip (SoC). In addition, in some embodiments, the memory device 100 and the host device 200 may be implemented as a system-on-chip.

The reception driver RX may receive the multi-level signal MLS transmitted through a channel from the memory device 100. According to the operating environment of the memory device 100 and the host device 200 or the channel environment, a difference such as a timing skew may occur between the multi-level signal MLS transmitted from the transmission driver TX of the memory device 100 and the multi-level signal MLS received by the reception driver RX of the host device 200.

The signal controller SC may check whether such timing skew occurs. In some embodiments, the signal controller SC may include an eye open monitor (EOM) for checking whether such timing skew occurs. However, embodiments of the present disclosure are not limited thereto.

The signal controller SC may generate a feedback signal FS by checking whether a timing skew has occurred.

The feedback signal FS may include a first command that adjusts data signals (e.g., the PDATA1 to PDATA3 and the NDATA1 to NDATA3 of FIG. 2) provided to the transmission driver TX. In addition, the feedback signal FS may include a second command for adjusting the signal level of the multi-level signal MLS by adjusting the enable codes (e.g., the PECODE1 to PECODE3 and the NECODE1 to NECODE3 of FIG. 2) of the transmission driver TX to adjust the on-resistance of the pull-up circuits (PUC1 to PUC3 and PDC1 to PDC3 of FIG. 2).

The signal controller SC may check the multi-level signal MLS received by the reception driver RX, include a necessary command in the feedback signal FS, and transmit the feedback signal FS to the memory device 100.

For example, when the data signal provided to the transmission driver TX is to be adjusted, the signal controller SC may transmit the feedback signal FS including the first command to the memory device 100. In addition, when the signal level of the multi-level signal MLS is to be adjusted, the signal controller SC may transmit the feedback signal FS including the second command to the memory device 100. In addition, when both the data signal provided to the transmission driver TX and the signal level of the multi-level signal MLS are to be adjusted, the signal controller SC may transmit the feedback signal FS including both the first command and the second command to the memory device 100.

That is, in an embodiment, to increase communication reliability in the host device 200 including the reception driver RX, reception characteristics such as a driving parameter of the reception driver RX are not adjusted, but signal characteristics are adjusted in the memory device 100 including the transmission driver TX through the feedback signal FS.

The controller CON of the memory device 100 may be provided with the feedback signal FS from the host device 200. In addition, based on the feedback signal FS, the controller CON may provide the first control signal CON1 to the data signal generator DSG to adjust the data signal, or may provide the second control signal CON2 to the transmission driver TX to adjust the signal level of the multi-level signal MSL. Hereinafter, the controller CON will be described in further detail with reference to FIG. 7.

Figure 7:
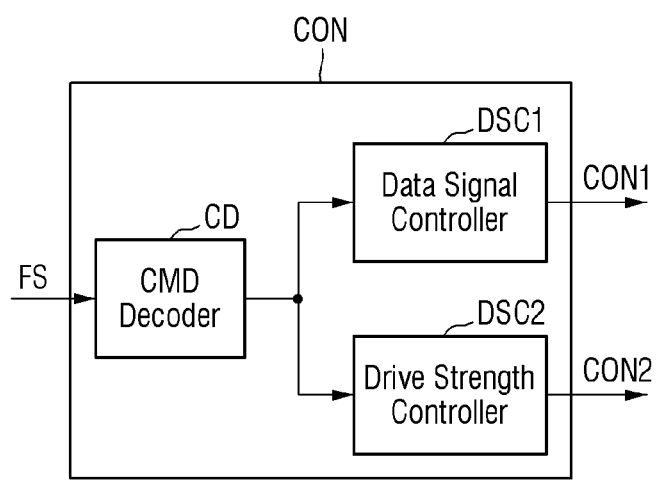
FIG. 7 is a diagram illustrating a controller of FIG. 1 according to embodiments of the present disclosure.

FIG. 7 is a diagram illustrating a controller of FIG. 1 according to embodiments of the present disclosure.

Referring to FIG. 7, the controller CON may include a command decoder CD (also referred to as a command decoder circuit), a data signal controller DSC1 (also referred to as a data signal controller circuit), and a drive strength controller DSC2 (also referred to as a drive strength controller circuit).

The command decoder CD may be provided with and decode the feedback signal FS. When the feedback signal FS includes a first command instructing adjustment of the data signal provided to the transmission driver TX, the command decoder CD may control the data signal controller DSC1 to output the first control signal CON1. When the feedback signal FS includes a second command instructing adjustment of the signal level of the multi-level signal MLS, the command decoder CD may control the drive strength controller DSC2 to output the second control signal CON2. Alternatively, when both the first command and the second command are included in the feedback signal FS, the command decoder CD may control the data signal controller DSC1 to output the first control signal CON1, and may control the drive strength controller DSC2 to output the second control signal CON2.

Hereinafter, an operation of controlling a data signal by the data signal controller DSC1 will be described with reference to FIGS. 8 to 10 and 11A to 11C.

Figure 8:
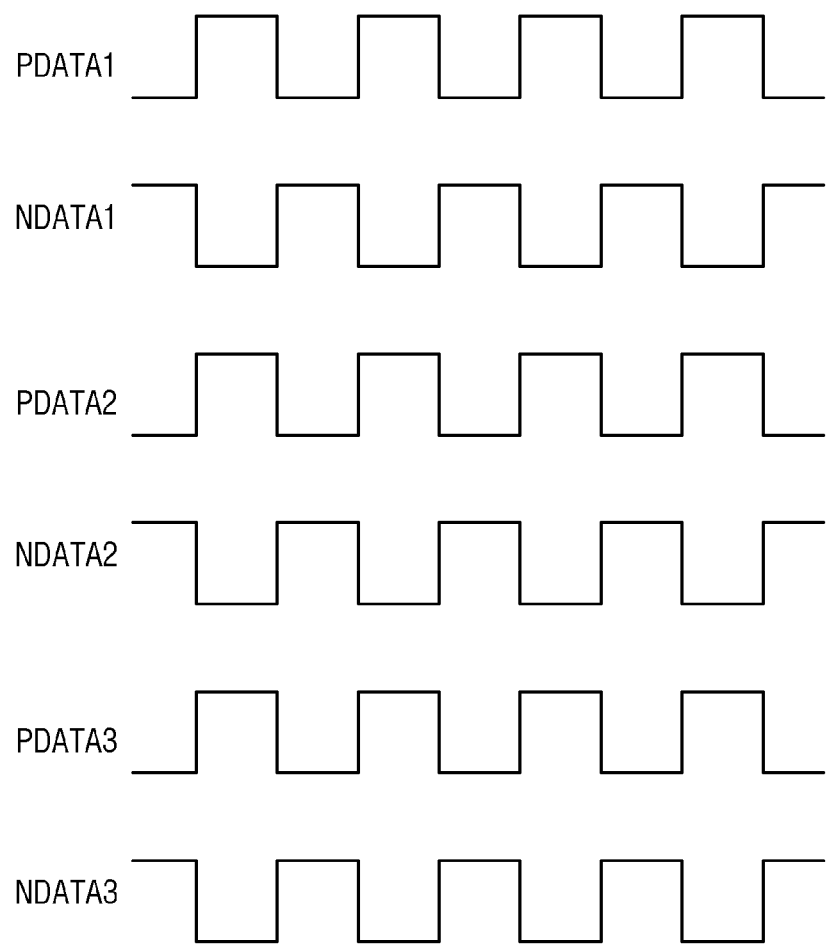

Referring to FIGS. 1, 2 and 8, the data signal generator DSG may generate the pull-up data signals PDATA1 to PDATA3 and the pull-down data signals NDATA1 to NDATA3 as illustrated in FIG. 8 to provide the data signals to the transmission driver TX. FIG. 8 is a diagram illustrating the pull-up data signals PDATA1 to PDATA3 and the pull-down data signals NDATA1 to NDATA3 of an embodiment in which the pull-up circuits PUC1 to PUC3 are configured with PMOS transistors and the pull-down circuits PDC1 to PDC3 are configured with NMOS transistors.

Figure 9:
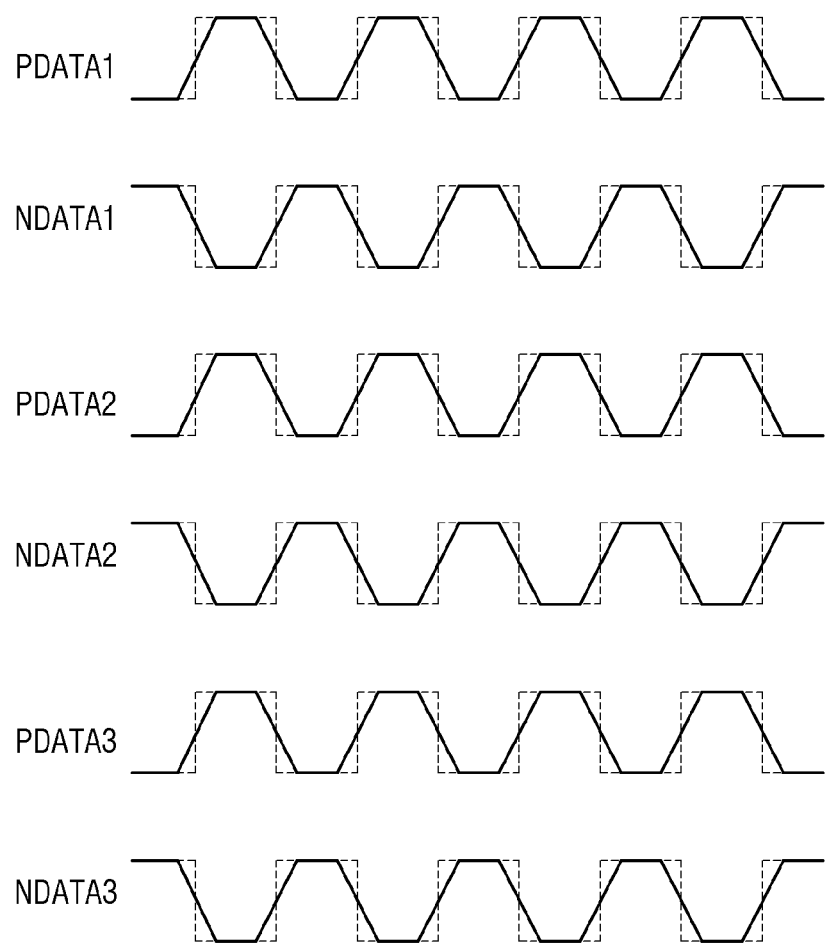

When the first command instructing the adjustment of the slope of the data signal is included in the feedback signal FS provided from the host device 200, the data signal generator DSG may adjust the slope of the pull-up data signals PDATA1 to PDATA3 and the pull-down data signals NDATA1 to NDATA3 as illustrated in FIG. 9. When the slope of the pull-up data signals PDATA1 to PDATA3 and the pull-down data signals NDATA1 to NDATA3 are adjusted in this way, the timing skew of the multi-level signal MLS received by the host device 200 may be reduced.

Figure 10:
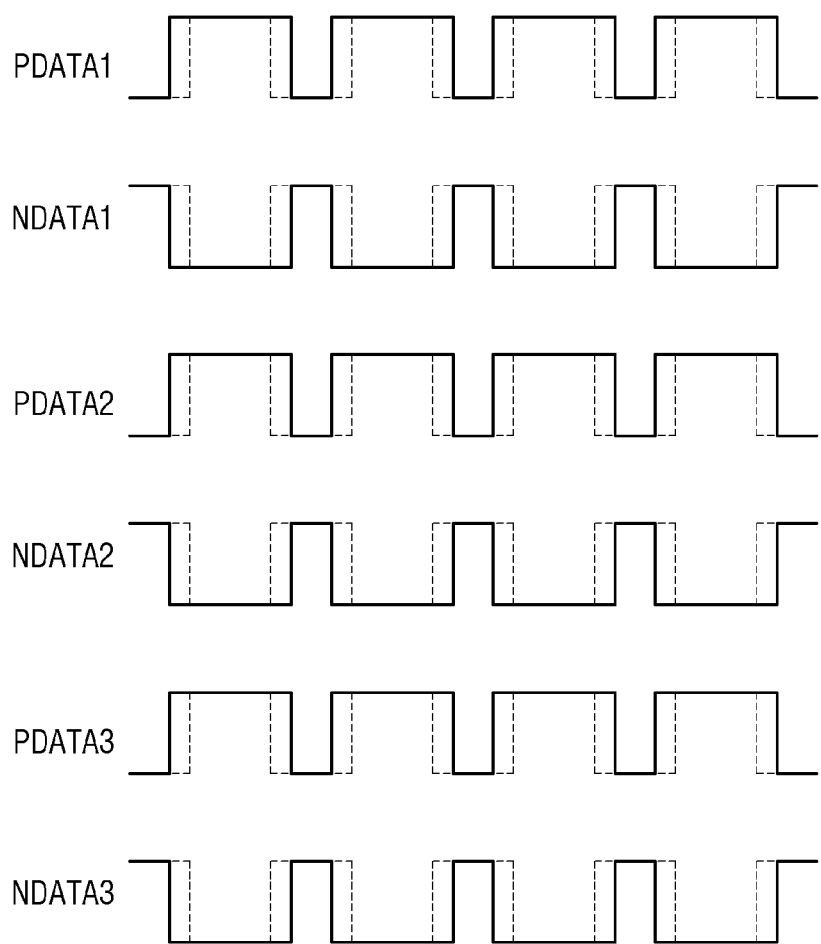

When the first command instructing the adjustment of the duty ratio of the data signal is included in the feedback signal FS provided from the host device 200, the data signal generator DSG may adjust the duty ratio of the pull-up data signals PDATA1 to PDATA3 and the pull-down data signals NDATA1 to NDATA3 as illustrated in FIG. 10.

When the duty ratios of the pull-up data signals PDATA1 to PDATA3 and the pull-down data signals NDATA1 to NDATA3 are adjusted in this way, the timing skew of the multi-level signal MLS received by the host device 200 may be reduced.

Figure 11A:
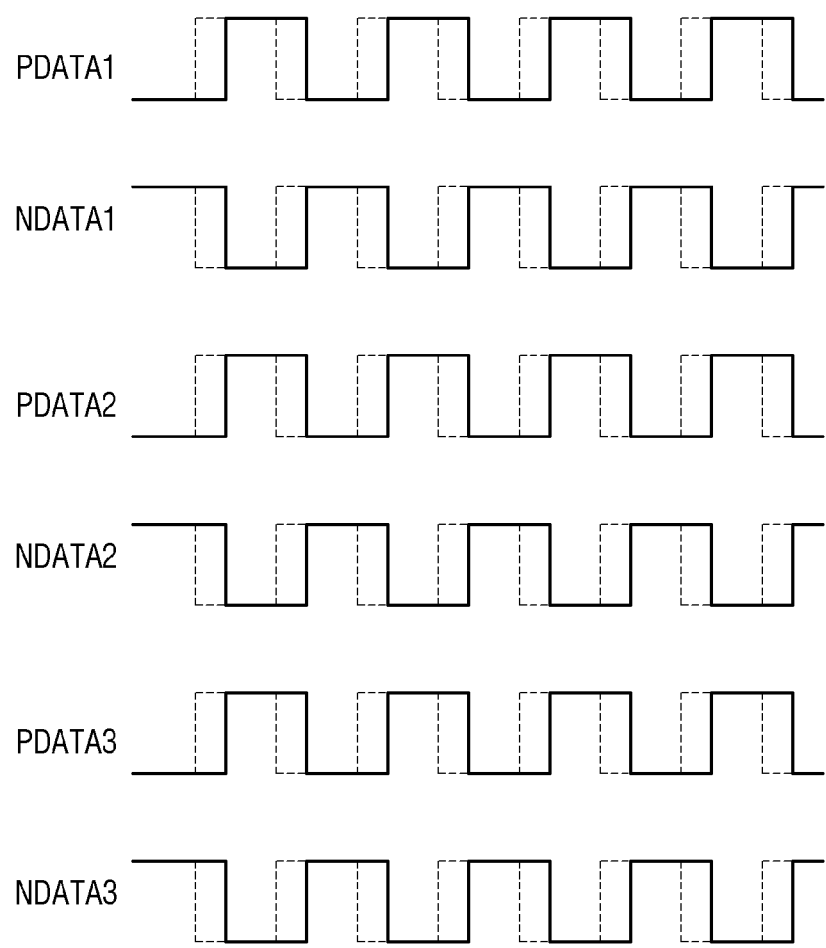

When the first command instructing the adjustment of the delay amount of the data signal is included in the feedback signal FS provided from the host device 200, the data signal generator DSG may adjust the delay amount of the pull-up data signals PDATA1 to PDATA3 and the pull-down data signals NDATA1 to NDATA3 as illustrated in FIG. 11A.

When the delay amounts of the pull-up data signals PDATA1 to PDATA3 and the pull-down data signals NDATA1 to NDATA3 are adjusted in this way, the timing skew of the multi-level signal MLS received by the host device 200 may be reduced.

In some embodiments, since the pull-up data signals PDATA1 to PDATA3 and the pull-down data signals NDATA1 to NDATA3 are signals independent of each other, the data signal generator DSG may also adjust the pull-up data signals PDATA1 to PDATA3 and the pull-down data signals NDATA1 to NDATA3 independently of each other based on the first command included in the feedback signal FS.

Figure 11B:
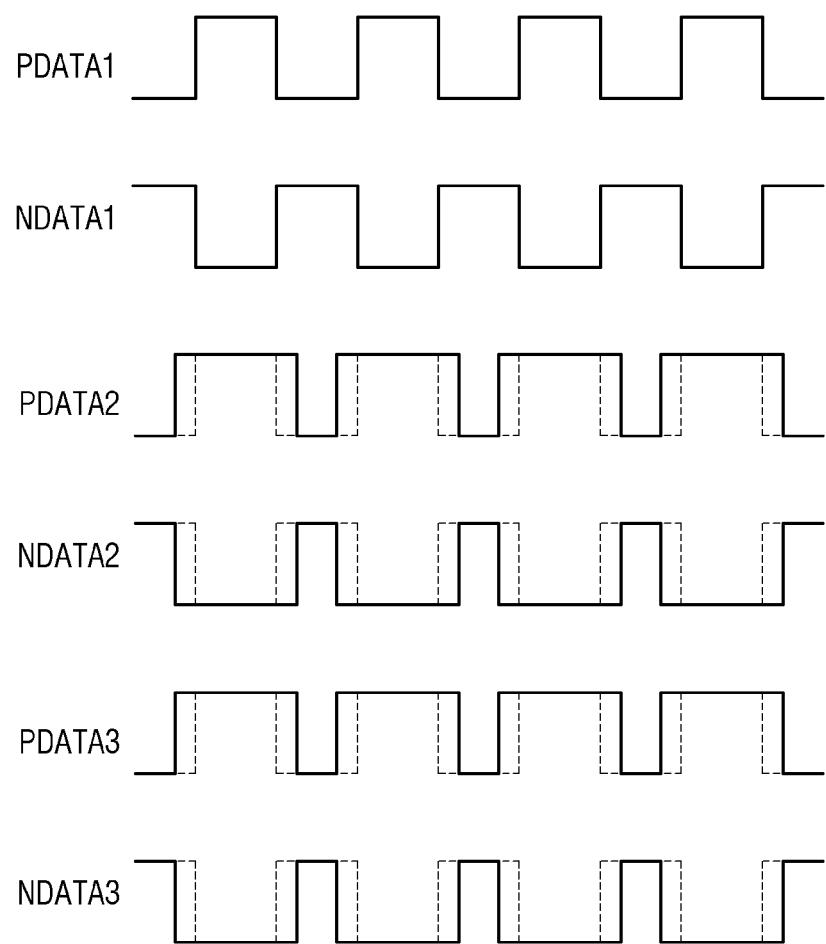

For example, the data signal generator DSG may adjust the duty ratio between the pull-up data signals PDATA2 and PDATA3 and the pull-down data signals NDATA2 and NDATA3 without adjusting the duty ratio of the pull-up data signal PDATA1 and the pull-down data signal NDATA1, as illustrated in FIG. 11B.

In addition, for example, as illustrated in FIG. 11C, the data signal generator DSG may adjust the slope for the pull-up data signal PDATA1 and the pull-down data signal NDATA1, may adjust the duty ratio for the pull-up data signal PDATA2 and the pull-down data signal NDATA2, and may also adjust the delay amount for the pull-up data signal PDATA3 and the pull-down data signal NDATA3. That is, the data signal controller DSC1 and the data signal generator DSG may adjust the pull-up data signals PDATA1 to PDATA3 and the pull-down data signals NDATA1 to NDATA3 independently of each other in various methods based on the first command included in the feedback signal FS.

Hereinafter, an operation of controlling a signal level of a multi-level signal by the drive strength controller SDC2 will be described with reference to FIGS. 12 to 17. First, an operation in which the transmission driver TX generates a multi-level signal will be described with reference to FIGS. 12 and 13.

Figures 12, 13:
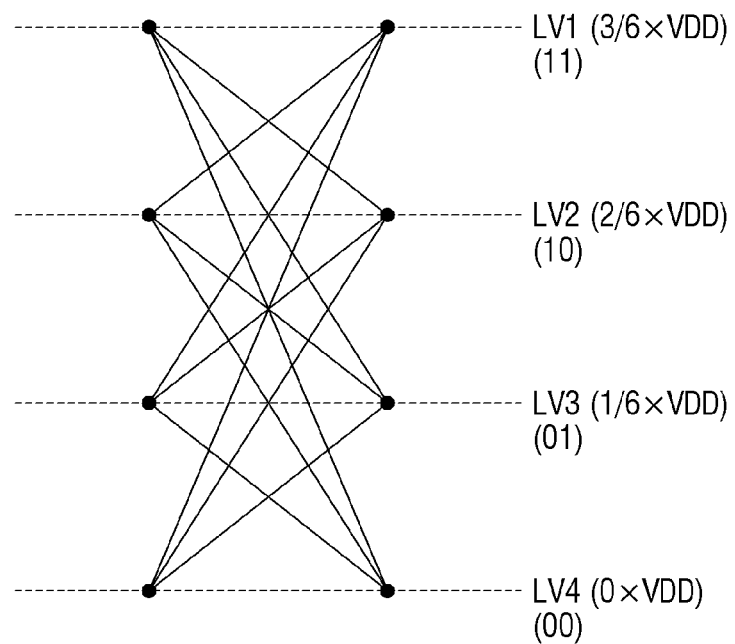
FIGS. 12 and 13 are diagrams for describing an operation in which the transmission driver of FIG. 1 generates a multi-level signal according to embodiments of the present disclosure.

FIGS. 12 and 13 are diagrams for describing an operation in which the transmission driver of FIG. 1 generates a multi-level signal according to embodiments of the present disclosure.

Referring to FIGS. 2, 12 and 13, as described above, the pull-up circuits PUC1 to PUC3 are turned on or off by the pull-up data signals PDATA1 to PDATA3, respectively, and the pull-down circuits PDC1 to PDC3 are turned on or off by the pull-down data signals NDATA1 to NDATA3, respectively, so that the transmission driver TX may output the multi-level signal MLS.

Hereinafter, for operation description, a case in which the resistance when each of the pull-up circuits PUC1, PUC2, and PUC3 of FIG. 2 is enabled (e.g., is turned on) is 120Ω and the resistance when each of the pull-down circuits PDC1, PDC2, and PDC3 is enabled is 120Ω will be described as an example. In addition, a case in which the ODT resistance Rodt of a GND termination method is 40Ω will be described as an example.

The signal level of the multi-level signal MLS received by the reception driver RX of the host device 200 may be expressed as Equation 1 below.

$$\text{Signal level} = (Rpd \| Rodt / (Rpu + (Rpd \| Rodt))) * Vdd \quad \text{Equation 1:}$$

Here, Rpd is the resistance value of the pull-down circuit, Rpu is the resistance value of the pull-up circuit, and Rodt is the resistance value of the ODT resistor. Rpd∥Rodt is the parallel resistance value of Rpd and Rodt.

Referring to FIGS. 2, 12 and 13, when the data outputted from the transmission driver TX is 11, the data generator DSG generates the pull-up data signals PDATA1 to PDATA3 enabling all of the pull-up circuits PUC1, PUC2, and PUC3 and the pull-down data signals NDATA1 to NDATA3 disabling all of the pull-down circuits PDC1, PDC2 and PDC3.

Accordingly, all of the pull-up circuits PUC1, PUC2, and PUC3 are enabled, and all of the pull-down circuits PDC1, PDC2, and PDC3 are disabled. Accordingly, the Rpu value becomes 40Ω, Rpd∥Rodt becomes 40Ω, and the multi-level signal MLS has a signal level LV1 of 40Ω/(40Ω+40Ω) *Vdd=½*Vdd.

Next, when the data outputted from the transmission driver TX is 10, the data generator DSG generates the pull-up data signals PDATA1 to PDATA3 and the pull-down data signals NDATA1 to NDATA3 that enable the pull-up circuits PUC2 and PUC3 and the pull-down circuit PDC3 and disable the pull-up circuit PUC1 and the pull-down circuits PDC1 and PDC2.

Accordingly, the pull-up circuits PUC2 and PUC3 and the pull-down circuit PDC3 are enabled, and the pull-up circuit PUC1 and the pull-down circuits PDC1 and PDC2 are disabled. Accordingly, the Rpu value becomes 60Ω, Rpd∥Rodt becomes 30Ω, and the multi-level signal MLS has a signal level LV2 of 30Ω/(60Ω+30Ω)*Vdd=⅓*Vdd.

Next, when the data outputted from the transmission driver TX is 01, the data generator DSG generates the pull-up data signals PDATA1 to PDATA3 and the pull-down data signals NDATA1 to NDATA3 that enable the pull-up circuit PUC3 and the pull-down circuits PDC2 and PDC3 and disable the pull-up circuits PUC1 and PUC2 and the pull-down circuit PDC1.

Accordingly, the pull-up circuit PUC3 and the pull-down circuits PDC2 and PDC3 are enabled, and the pull-up circuits PUC1 and PUC2 and the pull-down circuit PDC1 are disabled. Accordingly, the Rpu value becomes 120Ω, Rpd∥Rodt becomes 24Ω, and the multi-level signal MLS has a signal level LV3 of 24Ω/(120Ω+24Ω)*Vdd=⅙*Vdd.

Next, when data outputted from the transmission driver TX is 00, the data generator DSG generates the pull-up data signals PDATA1 to PDATA3 and the pull-down data signals NDATA1 to NDATA3 that disable all of the pull-up circuits PUC1, PUC2, and PUC3 and enable all of the pull-down circuits PDC1, PDC2, and PDC3.

Accordingly, all of the pull-up circuits PUC1, PUC2, and PUC3 are disabled, and all of the pull-down circuits PDC1, PDC2, and PDC3 are enabled. All of the pull-up circuits PUC1, PUC2, and PUC3 are disabled, so that the multi-level signal MLS has a signal level LV4 of 0*Vdd.

As such, the signal level of the multi-level signal MLS may be determined by the on-resistance of the pull-up circuits PUC1, PUC2, and PUC3 and the pull-down circuits PDC1, PDC2, and PDC3.

The drive strength controller SDC2 may adjust the signal level of the multi-level signal MLS by further adjusting the on-resistance of the pull-up circuits PUC1, PUC2, and PUC3 and the pull-down circuits PDC1, PDC2, and PDC3.

Figure 14:
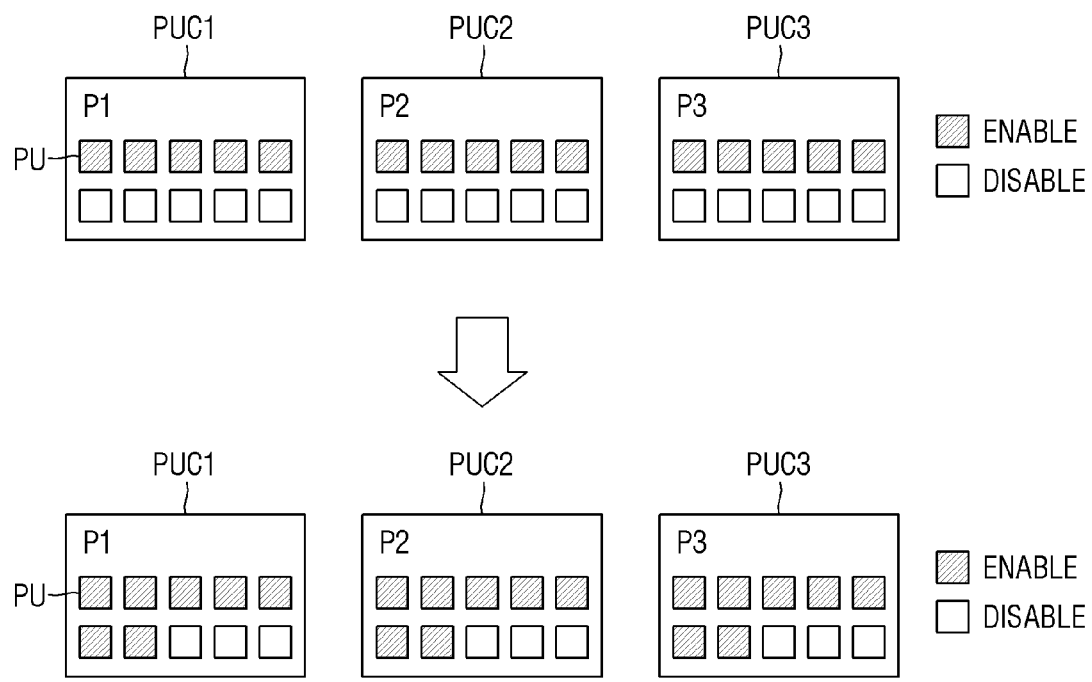
FIGS. 14 to 17 are diagrams for describing an operation of a drive strength controller of FIG. 7 according to embodiments of the present disclosure.

Referring to FIG. 14, as described above, each of the pull-up circuits PUC1, PUC2, and PUC3 may include a plurality of pull-up units PU. In addition, the pull-up enable codes PECODE1, PECODE2, and PECODE3 may determine the number of pull-up units PU enabled among the pull-up units PU included in each of the pull-up circuits PUC1, PUC2, and PUC3. In some embodiments, the drive strength controller SDC2 may further adjust the on-resistance of each of the pull-up circuits PUC1, PUC2, and PUC3 by adjusting the pull-up enable codes PECODE1, PECODE2, and PECODE3 to adjust the number of pull-up units PU enabled in each of the pull-up circuits PUC1, PUC2, and PUC3.

In some embodiments, as illustrated in FIG. 14, the drive strength controller SDC2 may increase the number of pull-up units PU enabled in each of the pull-up circuits PUC1, PUC2, and PUC3 by adjusting the pull-up enable codes PECODE1, PECODE2, and PECODE3. In this case, the on-resistance of each of the pull-up circuits PUC1, PUC2, and PUC3 may be decreased, and accordingly, the signal level of the multi-level signal MLS may be increased.

Figure 15:
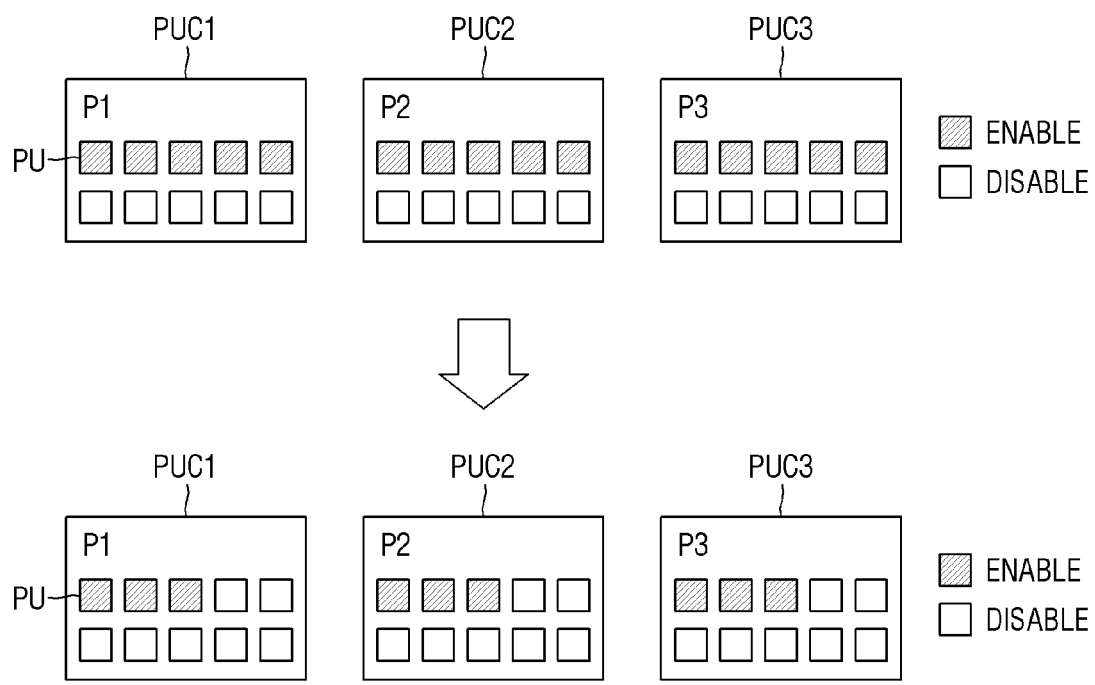

In some embodiments, as illustrated in FIG. 15, the drive strength controller SDC2 may decrease the number of pull-up units PU enabled in each of the pull-up circuits PUC1, PUC2, and PUC3 by adjusting the pull-up enable codes PECODE1, PECODE2, and PECODE3. In this case, the on-resistance of each of the pull-up circuits PUC1, PUC2, and PUC3 may increase, and accordingly, the signal level of the multi-level signal MLS may decrease.

Figure 16:
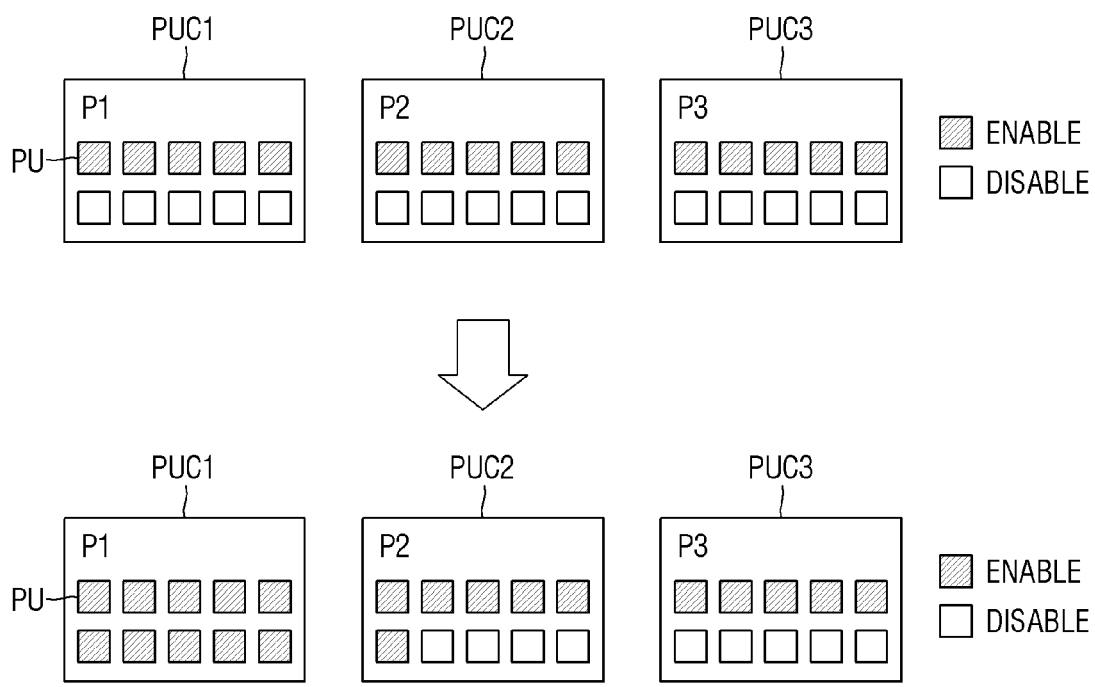

In some embodiments, as illustrated in FIG. 16, the drive strength controller SDC2 may also adjust the number of pull-up units PU enabled in each of the pull-up circuits PUC1, PUC2, and PUC3 differently from each other by adjusting the pull-up enable codes PECODE1, PECODE2, and PECODE3. For example, the drive strength controller SDC2 may perform adjustment so that the number of pull-up units PU enabled in the pull-up circuit PUC1 is greater than the number of pull-up units PU enabled in the pull-up circuit PUC2, and the number of pull-up units PU enabled in the pull-up circuit PUC3 does not change. In this case, as the on-resistance of the pull-up circuits PUC1 and PUC2 decreases, the signal level of the multi-level signal MLS may be increased.

Figure 17:
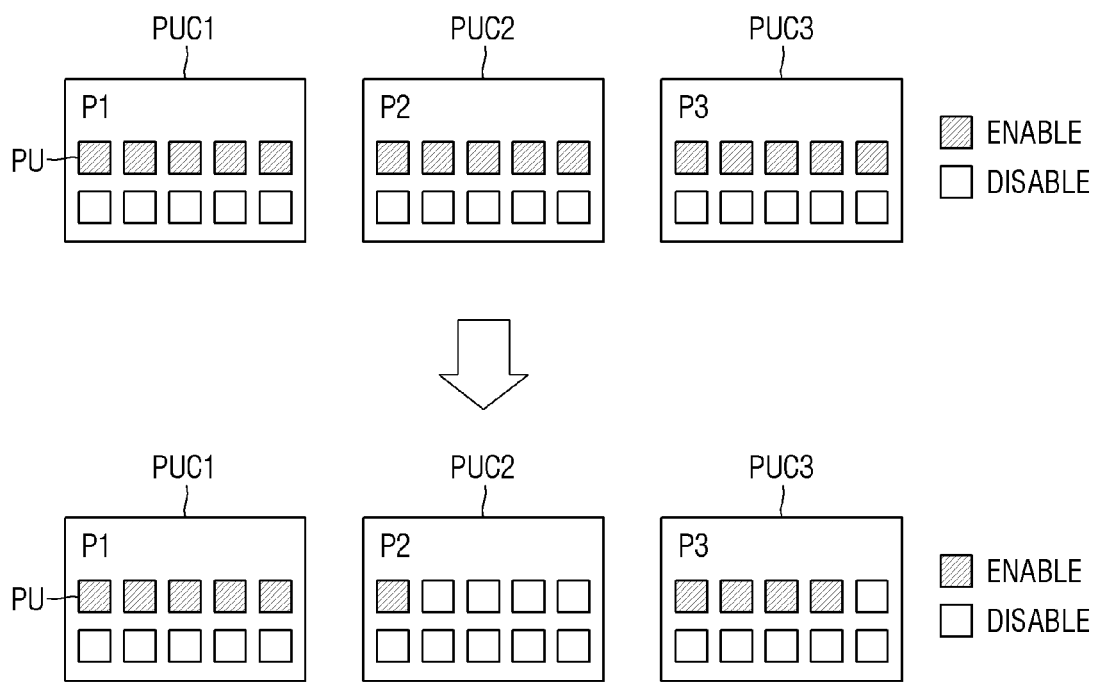

In some embodiments, as illustrated in FIG. 17, the drive strength controller SDC2 may also adjust the number of pull-up units PU enabled in each of the pull-up circuits PUC1, PUC2, and PUC3 differently from each other by adjusting the pull-up enable codes PECODE1, PECODE2, and PECODE3. For example, the drive strength controller SDC2 may perform adjustment so that the number of pull-up units PU enabled in the pull-up circuit PUC2 is less than the number of pull-up units PU enabled in the pull-up circuit PUC3, and the number of pull-up units PU enabled in the pull-up circuit PUC1 does not change. In this case, as the on-resistance of the pull-up circuits PUC2 and PUC3 increases, the signal level of the multi-level signal MLS may be decreased.

In FIGS. 14 to 17, only an example has been described in which the drive strength controller SDC2 adjusts the on-resistance of the pull-up circuits PUC1, PUC2, and PUC3, but it is to be understood that the drive strength controller SDC2 may adjust the signal level of the multi-level signal MLS by adjusting the pull-down enable codes NECODE1, NECODE2, and NECODE3 to similarly adjust the on-resistance of the pull-down circuits PDC1, PDC2, and PDC3.

Hereinafter, an operation of a memory system according to embodiments of the present disclosure will be described with reference to FIGS. 18 to 21.

Figure 18:
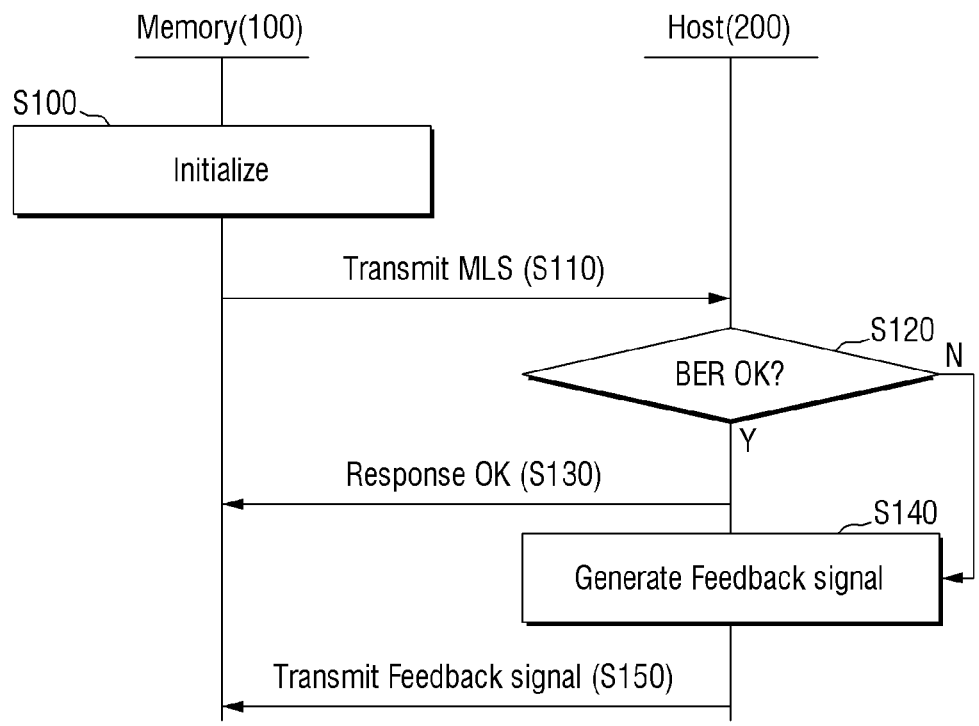
FIG. 18 is a flowchart illustrating an operation of a memory system according to embodiments of the present disclosure.
Figure 19:
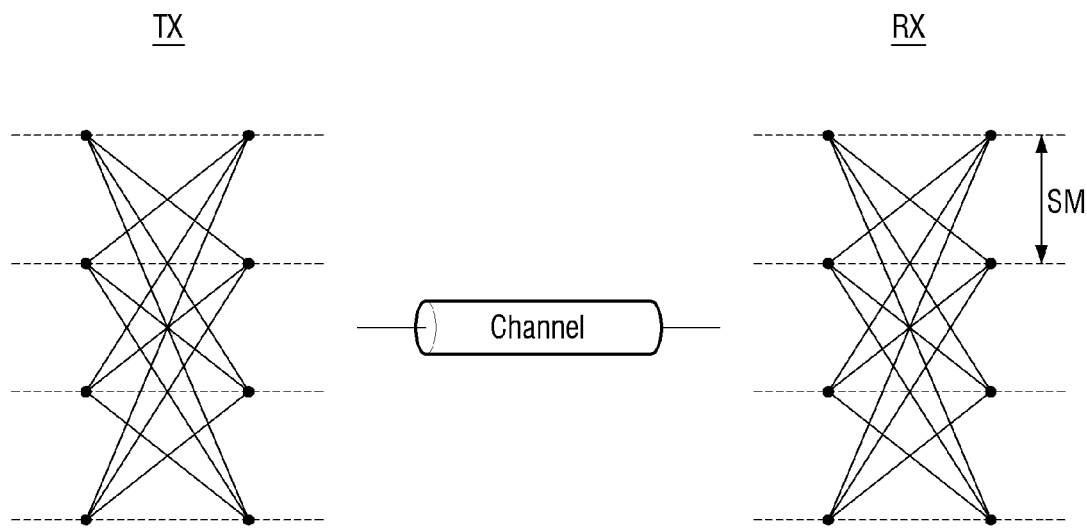
FIGS. 19 to 21 are diagrams for describing an operation of a memory system according to embodiments of the present disclosure.
Figure 20:
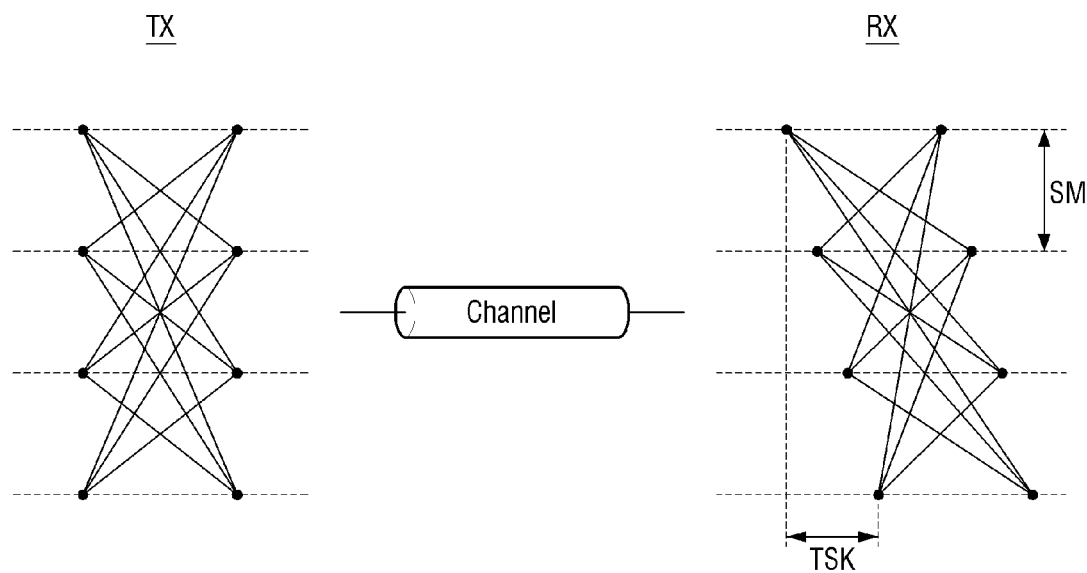
Figure 21:
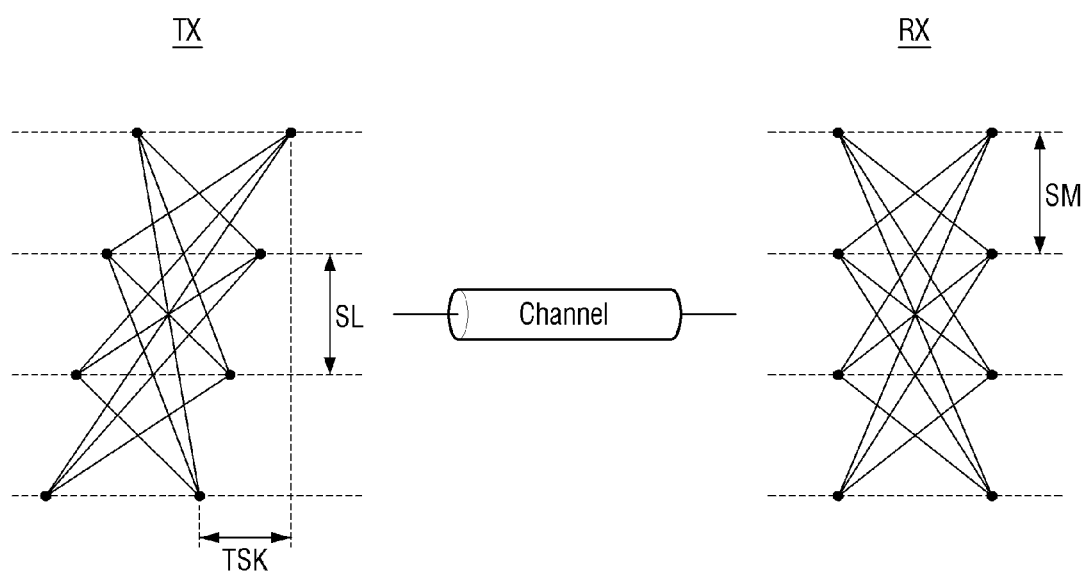

FIG. 18 is a flowchart illustrating an operation of a memory system according to embodiments of the present disclosure. FIGS. 19 to 21 are diagrams for describing an operation of a memory system according to embodiments of the present disclosure.

Referring to FIGS. 1 and 18, the memory device 100 is initialized (operation S100). For example, when the memory device 100 starts driving for the first time, the memory device 100 wakes up from a sleep mode, or power starts to be supplied to the memory device 100, initialization may proceed.

Next, the memory device 100 transmits the multi-level signal MLS to the host device 200 (operation S110).

Upon receiving the multi-level signal MLS, the host device 200 checks whether a bit error rate (BER) is less than or equal to a threshold value (operation S120).

If the bit error rate is less than the threshold value (Y in operation S120), an OK response signal is transmitted to the memory device 100 (operation S130).

As such, when the bit error rate is less than or equal to the threshold value, as illustrated in FIG. 19, a timing skew TSK of FIG. 20 between the multi-level signal transmitted by the transmission driver TX and the multi-level signal received by the reception driver RX does not exist. In this case, since a sensing margin SM in the reception driver RX is sufficient, the bit error rate is not high.

Referring back to FIG. 18, if the bit error rate is equal to or greater than the threshold value (N in operation S120), the host device 200 generates a feedback signal through the above-described operation (operation S140).

As such, when the bit error rate is equal to or greater than the threshold value, as illustrated in FIG. 20, the timing skew TSK between the respective signal levels in the multi-level signal received by the reception driver RX, unlike the multi-level signal transmitted from the transmission driver TX, exists. In this case, since the optimal sampling timing of each signal level in the reception driver RX is different, the sensing margin SM for a specific signal level at a specific sampling timing may not be sufficient, and thus, the bit error rate may be high.

Referring back to FIG. 18, the host device 200 transmits a feedback signal to the memory device (operation S150).

As described above, the feedback signal may include a first command and a second command for adjusting the multi-level signal outputted from the transmission driver TX. The memory device 100 provided with the feedback signal may output a multi-level signal for compensating for the timing skew TSK as illustrated in FIG. 21 by performing the above-described adjustment. Accordingly, a multi-level signal having a low bit error rate may be received by the reception driver RX.

As such, in the memory system according to an embodiment, to increase communication reliability in the host device 200 including the reception driver RX, reception characteristics such as a driving parameter of the reception driver RX are not adjusted, but signal characteristics are adjusted in the memory device 100 including the transmission driver TX through the feedback signal FS. In addition, to compensate for the timing skew in the reception driver RX, not only the data signal provided to the transmission driver TX is adjusted, but also the on-resistance of the pull-up circuit and the pull-down circuit included in the transmission driver TX is further adjusted, so that the signal level of the multi-level signal is also adjusted. Accordingly, reliable signal communication between the memory device 100 and the host device 200 may be realized according to embodiments of the present disclosure.

Figure 22A:
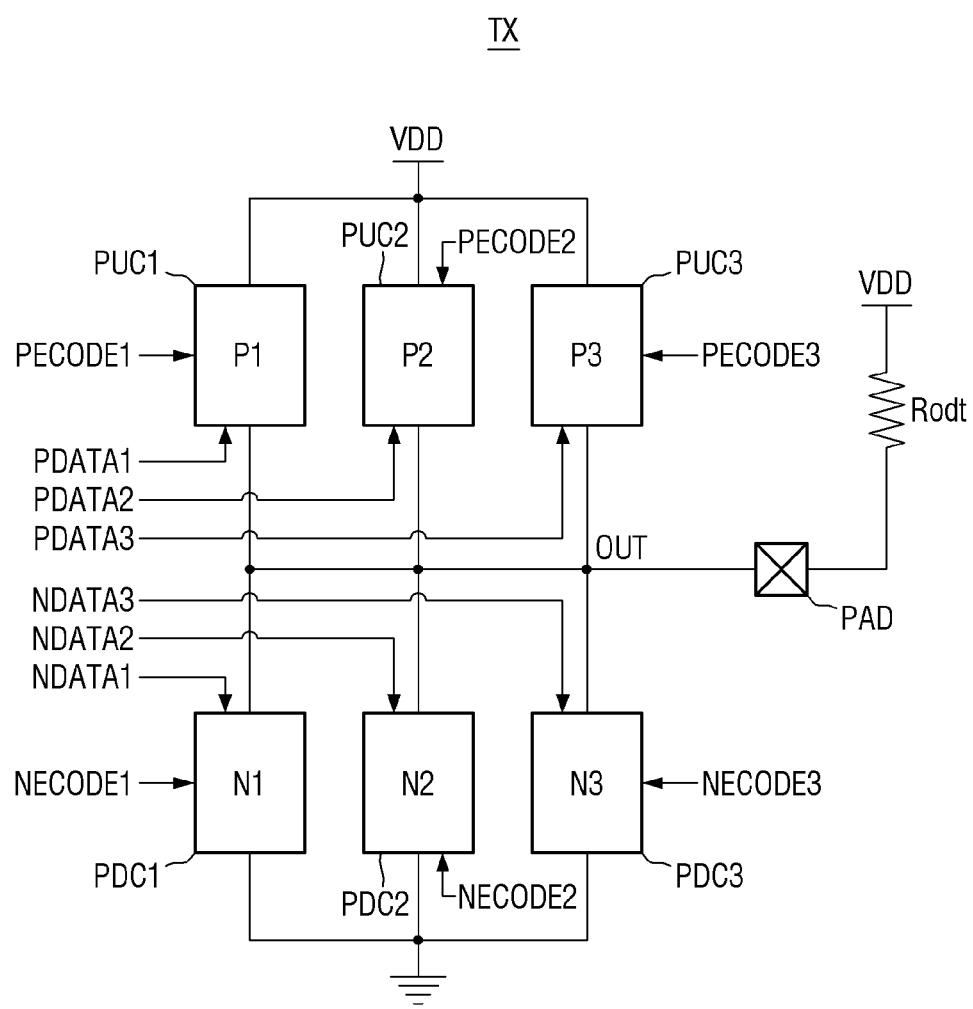
FIG. 22A is a diagram illustrating a transmission driver according to embodiments of the present disclosure.
Figure 22B:
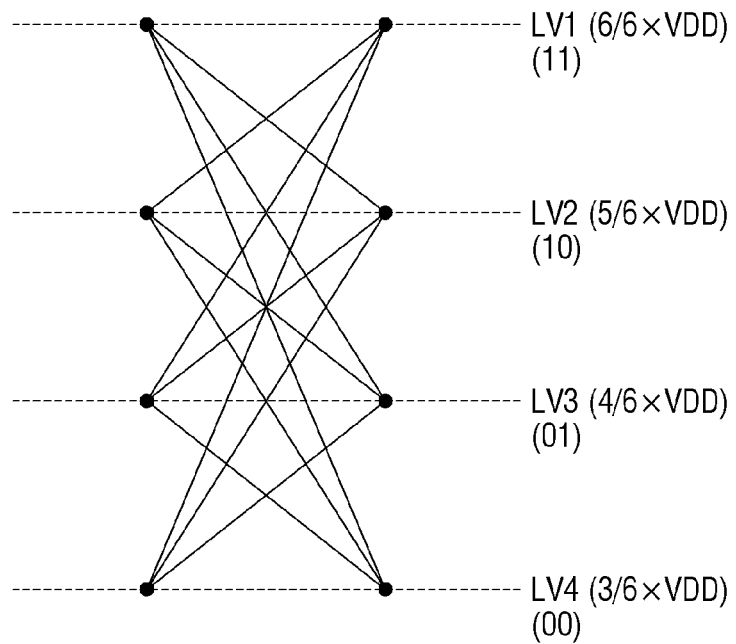

FIG. 22A is a diagram illustrating a transmission driver according to embodiments of the present disclosure. FIGS. 22B and 22C are diagrams for describing an operation of the transmission driver of FIG. 22A according to embodiments of the present disclosure.

In the following description, for convenience of explanation, redundant description of components and technical aspects previously described will be omitted.

Referring to FIG. 22A, the transmission driver TX according to an embodiment may include the ODT resistor Rodt of a power voltage termination (VDD termination) method.

In this case, as illustrated in FIGS. 22B to 22C, when the data outputted from the transmission driver TX is 11, the data generator DSG generates the pull-up data signals PDATA1 to PDATA3 enabling all of the pull-up circuits PUC1, PUC2, and PUC3 and the pull-down data signals NDATA1 to NDATA3 disabling all of the pull-down circuits PDC1, PDC2 and PDC3.

Accordingly, all of the pull-up circuits PUC1, PUC2, and PUC3 are enabled, and all of the pull-down circuits PDC1, PDC2, and PDC3 are disabled, so that the multi-level signal MLS may have a signal level of 1*Vdd.

Next, when the data outputted from the transmission driver TX is 10, the data generator DSG generates the pull-up data signals PDATA1 to PDATA3 and the pull-down data signals NDATA1 to NDATA3 that enable the pull-up circuits PUC2 and PUC3 and the pull-down circuit PDC3 and disable the pull-up circuit PUC1 and the pull-down circuits PDC1 and PDC2.

Accordingly, the pull-up circuits PUC2 and PUC3 and the pull-down circuit PDC3 are enabled, and the pull-up circuit PUC1 and the pull-down circuits PDC1 and PDC2 are disabled, so that the multi-level signal MLS may have a signal level of $5/6$*Vdd.

Next, when the data outputted from the transmission driver TX is 01, the data generator DSG generates the pull-up data signals PDATA1 to PDATA3 and the pull-down data signals NDATA1 to NDATA3 that enable the pull-up circuit PUC3 and the pull-down circuits PDC2 and PDC3 and disable the pull-up circuits PUC1 and PUC2 and the pull-down circuit PDC1.

Accordingly, the pull-up circuit PUC3 and the pull-down circuits PDC2 and PDC3 are enabled, and the pull-up circuits PUC1 and PUC2 and the pull-down circuit PDC1 are disabled, so that the multi-level signal MLS may have a signal level of $4/6$*Vdd.

Next, when data outputted from the transmission driver TX is 00, the data generator DSG generates the pull-up data signals PDATA1 to PDATA3 and the pull-down data signals NDATA1 to NDATA3 that disable all of the pull-up circuits PUC1, PUC2, and PUC3 and enable all of the pull-down circuits PDC1, PDC2, and PDC3.

Accordingly, all of the pull-up circuits PUC1, PUC2, and PUC3 are disabled, and all of the pull-down circuits PDC1, PDC2, and PDC3 are enabled, so that the multi-level signal MLS may have a signal level of $3/6$*Vdd.

Figure 22D:
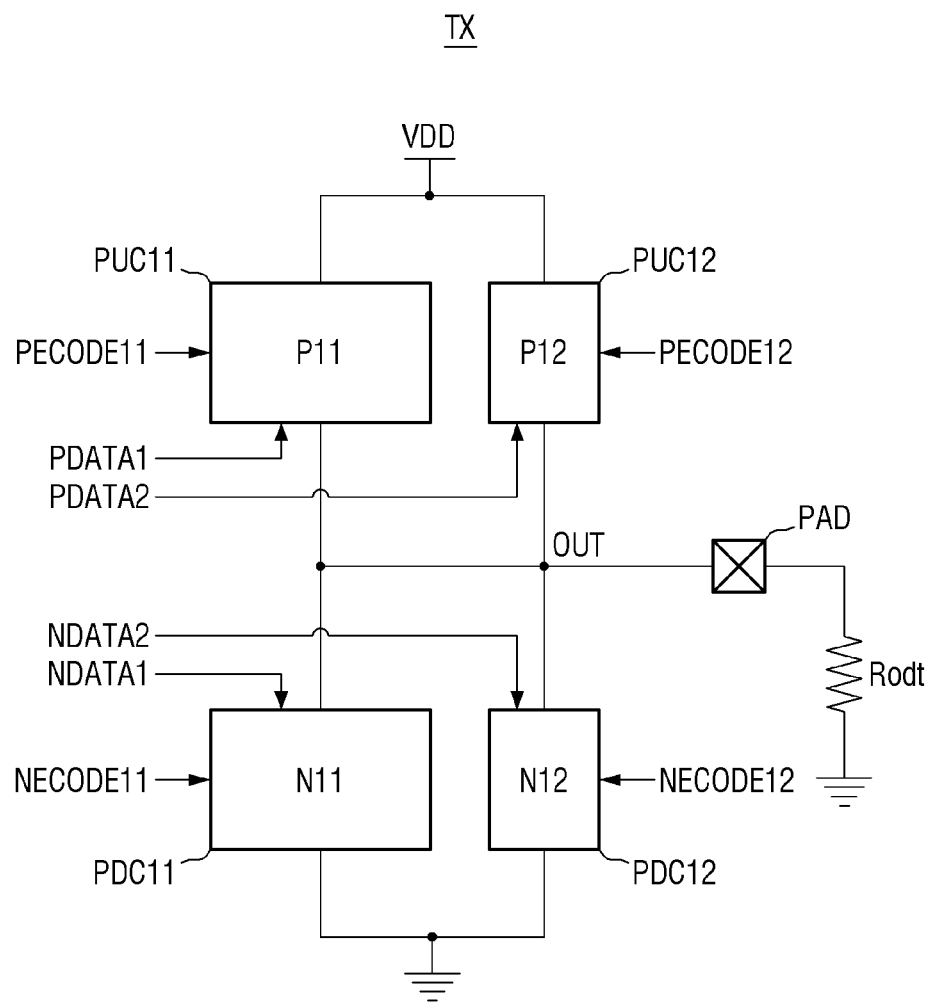
FIG. 22D is a diagram illustrating a transmission driver according to embodiments of the present disclosure.

FIG. 22D is a diagram illustrating a transmission driver according to embodiments of the present disclosure. In the following description, for convenience of explanation, redundant description of components and technical aspects previously described will be omitted.

Referring to FIG. 22D, the transmission driver TX according to an embodiment may include pull-up circuits PUC11 and PUC12 and pull-down circuits PDC11 and PDC12.

In an embodiment as illustrated in FIG. 2 above, the transmission driver TX includes three pull-up circuits to which independent pull-up enable codes are applied and three pull-down circuits to which independent pull-down enable codes are applied. In an embodiment as illustrated in FIG. 22D, the pull-up data signal PDATA1 and a pull-up enable code PECODE11 are applied to the pull-up circuit PUC11, the pull-up data signal PDATA2 and a pull-up enable code PECODE12 are applied to the pull-up circuit PUC12, the pull-down data signal NDATA1 and a pull-down enable code NECODE11 are applied to the pull-down circuit PDC11, and the pull-down data signal NDATA2 and a pull-down enable code NECODE12 are applied to the pull-down circuit PDC12.

In an embodiment according to FIG. 2, when the transmission driver TX transmits, for example, a 2-bit data signal such as 11, the data signal generator DSG generates the three pull-up data signals PDATA1 to PDATA3 and the three pull-down data signals NDATA1 to NDATA3, each of which is independent. In an embodiment according to FIG. 22D, when the transmission driver TX transmits, for example, a 2-bit data signal such as 11, the data signal generator DSG generates two pull-up data signals PDATA1 and PDATA2 and two pull-down data signals NDATA1 and NDATA2, each of which is independent.

In some embodiments, the pull-up data signal PDATA1, the pull-down data signal NDATA1, the pull-up enable code PECODE11, and the pull-down enable code NECODE11 may be most significant bits (MSBs), and the pull-up data signal PDATA2, the pull-down data signal NDATA2, the pull-up enable code PECODE12, and the pull-down enable code NECODE12 may be least significant bits (LSBs). However, embodiments of the present disclosure are not limited thereto.

Figure 23:
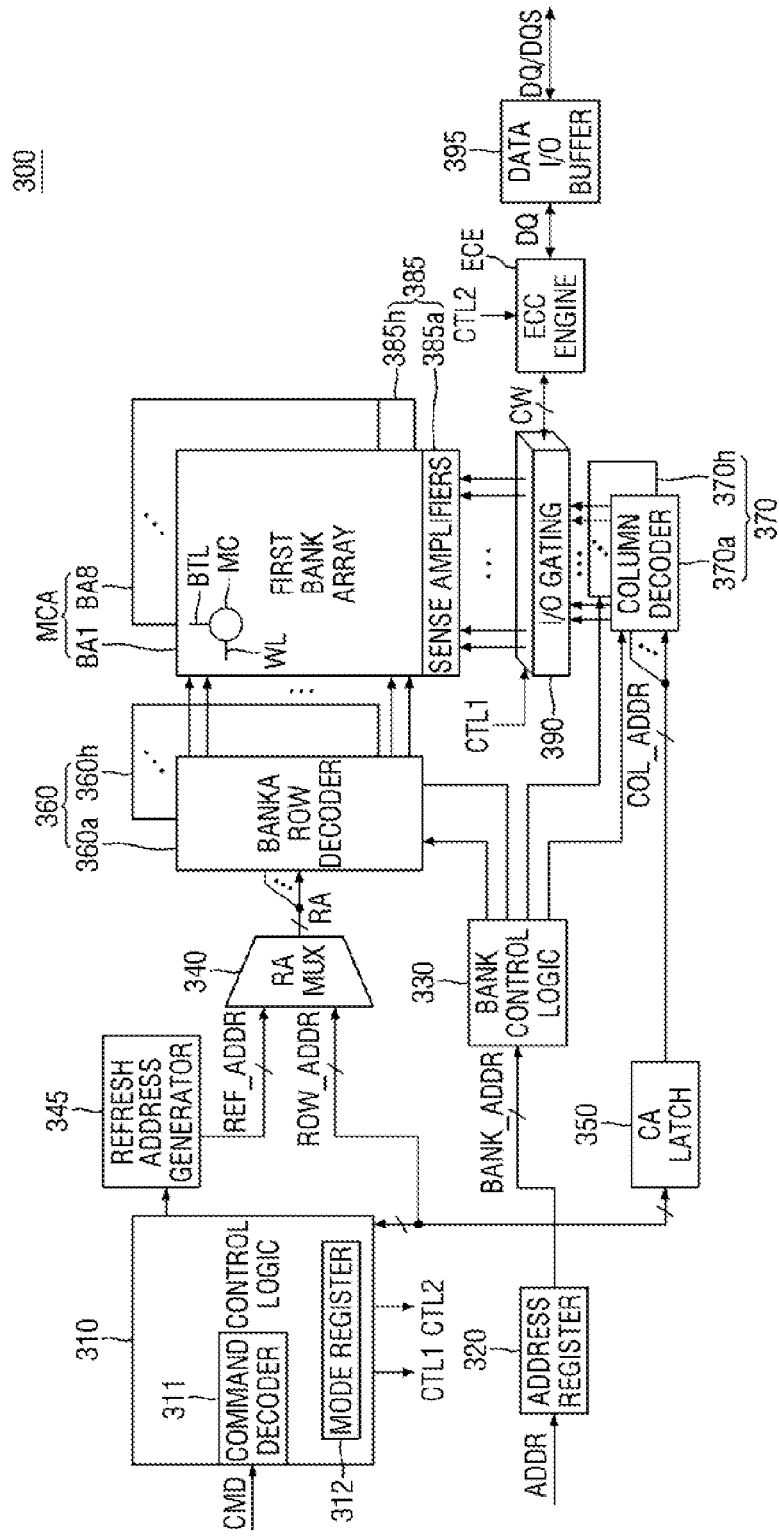
FIG. 23 is a diagram illustrating a memory device according to embodiments of the present disclosure.

FIG. 23 is a diagram illustrating a memory device according to embodiments of the present disclosure.

FIG. 23 is a diagram illustrating a case in which the aforementioned memory device 100 of FIG. 1 is a DRAM.

Referring to FIG. 23, a memory device 300 may include a control logic 310, an address register 320, a bank control logic 330, a row address multiplexer 340, a refresh address generator 345, a column address latch 350, a row decoder 360, a column decoder 370, a sense amplifier unit 385, an input/output gating circuit 390, a memory cell array MCA, an ECC engine ECE, and a data input/output buffer 395.

The memory cell array MCA may include a plurality of memory cells MC for storing data. For example, the memory cell array MCA may include first to eighth bank arrays BA1 to BA8. Each of the first to eighth bank arrays BA1 to BA8 may include a plurality of word lines WL, a plurality of bit lines BTL, and the plurality of memory cells MC disposed at the intersections of the word lines WL and the bit lines BTL that cross each other.

The memory cell array MCA may include the first to eighth bank arrays BA1 to BA8. FIG. 23 illustrates the memory device 300 including the eight bank arrays BA1 to BA8. However, embodiments of the present disclosure are not limited thereto, and the memory device 300 may include an arbitrary number of bank arrays according to embodiments.

The control logic 310 may control the operation of the memory device 300. For example, the control logic 310 may generate control signals CTL1 and CTL2 so that the memory device 300 performs an operation for writing data or an operation for reading data. The control logic 310 may include a command decoder 311 for decoding a command CMD received from an external host device, and a mode register 312 for setting an operation mode of the memory device 300.

For example, the command decoder 311 may generate control signals corresponding to the command CMD by decoding a write enable signal, a row address strobe signal, a column address strobe signal, a chip select signal, etc. The control logic 310 may also receive a clock signal and a clock enable signal for driving the memory device 300 in a synchronous manner.

In addition, the control logic 310 may control the refresh address generator 345 to generate a refresh row address REF_ADDR in response to the refresh command.

The address register 320 may receive an address ADDR from an external host device. For example, the address register 320 may receive the address ADDR including a bank address BANK_ADDR, a row address ROW_ADDR, and a column address COL_ADDR. The address register 320 may provide the received bank address BANK_ADDR to the bank control logic 330, may provide the received row address ROW_ADDR to the row address multiplexer 340, and may provide the received column address COL_ADDR to the column address latch 350.

The bank control logic 330 may generate bank control signals in response to the bank address BANK_ADDR received from the address register 320. In response to these bank control signals, a bank row decoder corresponding to a bank address BANK_ADDR among first to eighth bank row decoders 360a to 360h may be activated, and a bank column decoder corresponding to the bank address BANK_ADDR among first to eighth bank column decoders 370a to 370h may be activated.

The row address multiplexer 340 may receive the row address ROW_ADDR from the address register 320 and may receive the refresh row address REF_ADDR from the refresh address generator 345. The row address multiplexer 340 may selectively output the row address ROW_ADDR received from the address register 320 or the refresh row address REF_ADDR received from the refresh address generator 345 as a row address RA. The row address RA outputted from the row address multiplexer 340 may be applied to each of the first to eighth bank row decoders 360a to 360h.

The refresh address generator 345 may generate the refresh row address REF_ADDR for refreshing memory cells. The refresh address generator 345 may provide the refresh row address REF_ADDR to the row address multiplexer 340. Accordingly, memory cells disposed on the word line corresponding to the refresh row address REF_ADDR may be refreshed.

The column address latch 350 may receive the column address COL_ADDR from the address register 320 and temporarily store the received column address COL_ADDR. In addition, the column address latch 350 may gradually increase the received column address COL_ADDR in a burst mode. The column address latch 350 may apply the temporarily stored or gradually increased column address COL_ADDR to each of the first to eighth bank column decoders 370a to 370h.

The row decoder 360 may include the first to eighth bank row decoders 360a to 360h respectively connected to the first to eighth bank arrays BA1 to BA8. The column decoder 370 may include the first to eighth bank column decoders 370a to 370h respectively connected to the first to eighth bank arrays BA1 to BA8. The sense amplifier unit 385 may include first to eighth bank sense amplifiers 385a to 385h respectively connected to the first to eighth bank arrays BA1 to BA8.

The bank row decoder activated by the bank control logic 330 among the first to eighth bank row decoders 360a to 360h may decode the row address RA outputted from the row address multiplexer 340 to activate the word line corresponding to the row address RA. For example, the activated bank row decoder may apply a word line driving voltage to a word line corresponding to the row address RA.

The bank column decoder activated by the bank control logic 330 among the first to eighth bank column decoders

370a to 370h may activate the bank sense amplifiers 385a to 385h corresponding to the bank address BANK_ADDR and the column address COL_ADDR through the input/output gating circuit 390.

The input/output gating circuit 390 may include, together with circuits for gating input/output data, an input data mask logic, read data latches for storing data outputted from the first to eighth bank arrays BA1 to BA8, and write drivers for writing data to the first to eighth bank arrays BA1 to BA8.

A codeword CW to be read in one bank array among the first to eighth bank arrays BA1 to BA8 may be sensed by the bank sense amplifiers 385a to 385h corresponding to one bank array, and may be stored in read data latches.

The ECC engine ECE may perform ECC decoding on the codeword CW stored in the read data latches. When an error is detected in the data of the codeword CW, the ECC engine ECE may provide a corrected data signal DQ to an external memory controller through the data input/output buffer 395.

The data signal DQ to be written to one bank array among the first to eighth bank arrays BA1 to BA8 may be provided to the ECC engine ECE, and the ECC engine ECE may generate parity bits based on the data signal DQ and provide the data signal DQ and the parity bits to the input/output gating circuit 390. The input/output gating circuit 390 may write the data signal DQ and the parity bits to a subpage of one bank array through write drivers.

The data input/output buffer 395 may be provided with the data signal DQ and a data strobe signal DQS from outside of the memory device 300 (e.g., from the host) or transmit the data signal DQ and the data strobe signal DQS to outside of the memory device 300 (e.g., to the host).

In some embodiments, the data input/output buffer 395 may include a first data input/output buffer (e.g., a data buffer) that is provided with or transmits the data signal DQ and a second data input/output buffer (e.g., a data strobe buffer) that is provided with or transmits the data strobe signal DQS.

The data input/output buffer 395, in a write operation, may buffer or drive the data signal DQ (e.g., write data) to provide the data signal DQ to the ECC engine ECE, and in a read operation, may buffer or drive the data signal DQ (e.g., read data) provided from the ECC engine ECE to provide the data signal DQ to an external host device.

In some embodiments, the above-described transmission driver TX of FIG. 1 may be included in, for example, the data input/output buffer 395. In addition, the control logic 310 may perform the operation of the above-described controller CON of FIG. 1.

Figure 24:
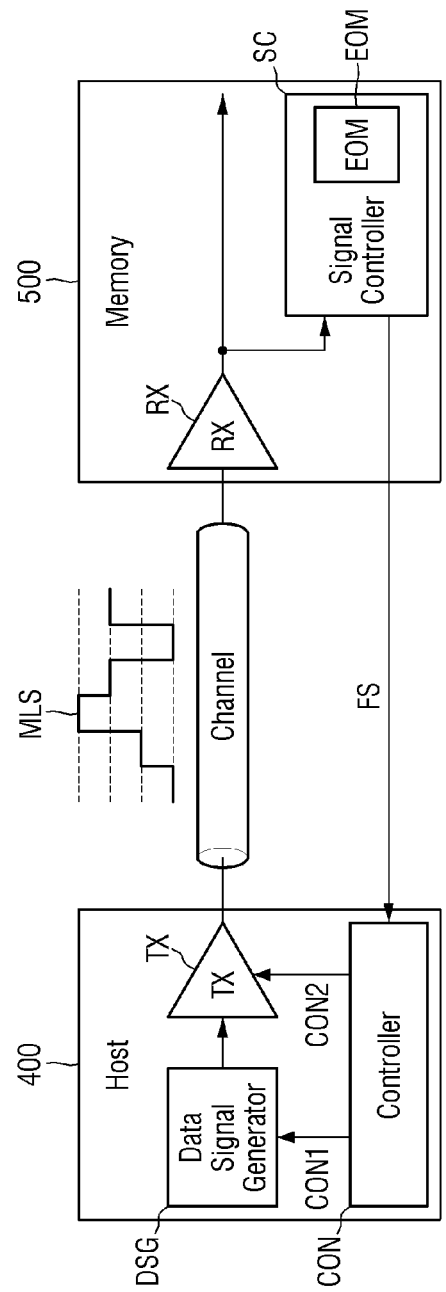
FIG. 24 shows a memory system according to embodiments of the present disclosure.

FIG. 24 shows a memory system according to embodiments of the present disclosure.

For convenience of explanation, a further description of components and technical aspects previously described is omitted, and the following description is mainly directed to differences from the above-described embodiments.

Referring to FIG. 24, in an embodiment, the host device 400 may include the data signal generator DSG, the transmission driver TX, and the controller CON. In addition, the memory device 500 may include the reception driver RX and the signal controller SC.

Figure 25:
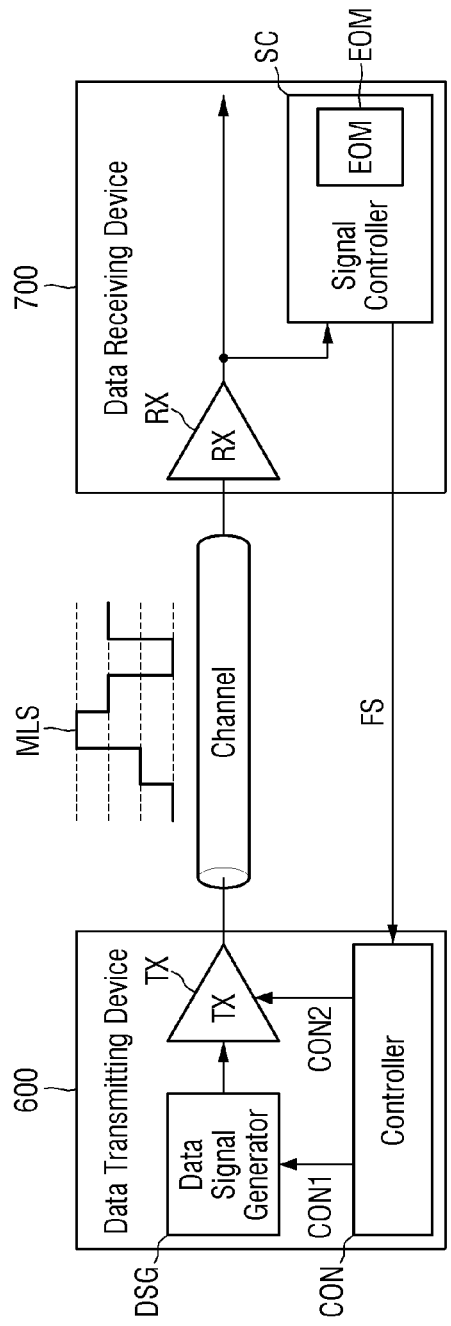
FIG. 25 is a diagram illustrating a signal transmission/reception system according to embodiments of the present disclosure.

FIG. 25 is a diagram illustrating a signal transmission/reception system according to embodiments of the present disclosure.

For convenience of explanation, a further description of components and technical aspects previously described is omitted, and the following description is mainly directed to differences from the above-described embodiments.

Referring to FIG. 25, a data transmitting device 600 may include the data signal generator DSG, the transmission driver TX, and the controller CON. In addition, a data receiving device 700 may include the reception driver RX and the signal controller SC.

The data transmitting device 600 may include various types of electronic devices that transmit data signals to the data receiving device 700. In addition, the data receiving device 700 may include various types of electronic devices that receive data signals from the data transmitting device 600. The channel may include both a wired channel and a wireless channel.

Figure 26:
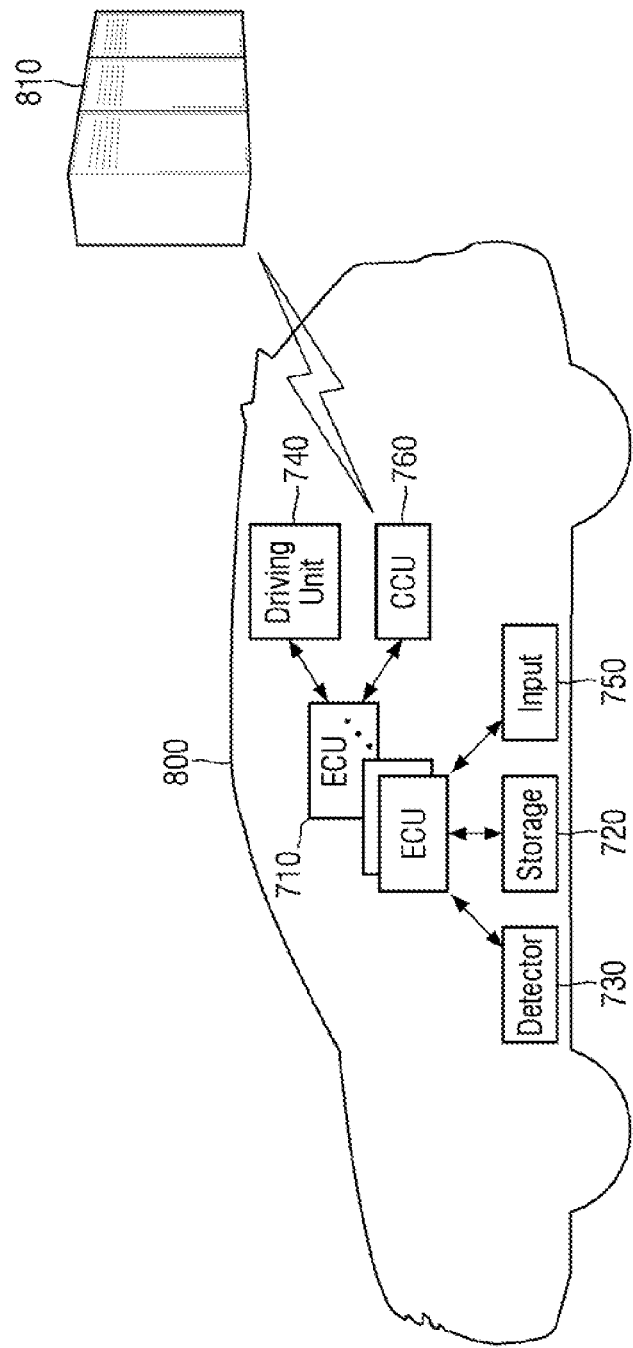
FIG. 26 is a diagram illustrating a vehicle in which a memory system is mounted, according to embodiments of the present disclosure.

FIG. 26 is a diagram illustrating a vehicle in which a memory system is mounted, according to embodiments of the present disclosure.

A vehicle 800 may include a plurality of electronic control units (ECU) 710, and a storage 720.

Each of the plurality of electronic control units 710 may be electrically, mechanically, and communicatively connected to at least one of a plurality of devices provided in the vehicle 800, and may control an operation of at least one device based on any one function performing command.

Here, the plurality of devices may include a detector 730 that acquires information utilized to perform at least one function, and a driving unit 740 that performs at least one function.

For example, the detector 730 may include various detection units and image acquisition units, and the driving unit 740 may include, for example, a fan and a compressor of an air conditioner, a fan of a ventilation device, an engine and motor of a power device, a motor of a steering device, a motor and a valve of a braking device, an opening/closing device of a door or a tailgate, etc.

The plurality of electronic control units 710 may communicate with the detector 730 and the driving unit 740 using, for example, at least one of Ethernet, low voltage differential signal (LVDS) communication, or local interconnect network (LIN) communication.

The plurality of electronic control units 710 may determine whether a function is to be performed based on the information acquired through the detector 730, control an operation of the driving unit 740 performing the function when it is determined that the corresponding function is to be performed, and control the amount of the operation based on the acquired information. In this case, the plurality of electronic control units 710 may store the acquired information in the storage 720 or read and use the information stored in the storage 720. In some embodiments, the plurality of electronic control units 710 may correspond to the aforementioned host device 200 of FIG. 1, and the storage 720 may correspond to the aforementioned memory device 100 of FIG. 1.

The plurality of electronic control units 710 may also control the operation of the driving unit 740 performing the corresponding function based on the function performing command inputted through the detector 730, and may also check the set amount corresponding to information inputted through the detector 730 and control the operation of the driving unit 740 performing the corresponding function based on the checked set amount.

Each electronic control unit 710 may independently control any one function, or may control any one function in association with other electronic control devices.

For example, when the distance to an obstacle detected through a distance detector is within a reference distance, the electronic control device of a collision avoidance device may output a warning sound regarding the collision with the obstacle through a speaker.

The electronic control device of an autonomous driving control device may perform autonomous driving, in association with the electronic control device of the vehicle terminal, the electronic control device of the image acquisition unit, and the electronic control device of the collision avoidance device, by receiving, for example, navigation information, road image information, and distance information from obstacles, and controlling, for example, the power device, the braking device, and the steering device using the received information.

A connectivity control unit (CCU) 760 is electrically, mechanically, and communicatively connected to each of the plurality of electronic control units 710, and performs communication with each of the plurality of electronic control units 710.

That is, the connectivity control unit 760 may directly perform communication with the plurality of electronic control units 710 provided inside the vehicle, may perform communication with an external server, and may perform communication with an external terminal through an interface.

Here, the connectivity control unit 760 may perform communication with the plurality of electronic control units 710, and may perform communication with a server 810 using, for example, an antenna and RF communication.

In addition, the connectivity control unit 760 may perform communication with the server 810 through wireless communication. In this case, the wireless communication between the connectivity control unit 760 and the server 810 is possible through various wireless communication methods, in addition to a WIFI module and a wireless broadband (WiBro) module, such as, for example, global system for mobile communication (GSM), code division multiple access (CDMA), wideband code division multiple access (WCDMA), universal mobile telecommunications system (UMTS), time division multiple access (TDMA), and long term evolution (LTE).

Figure 27:
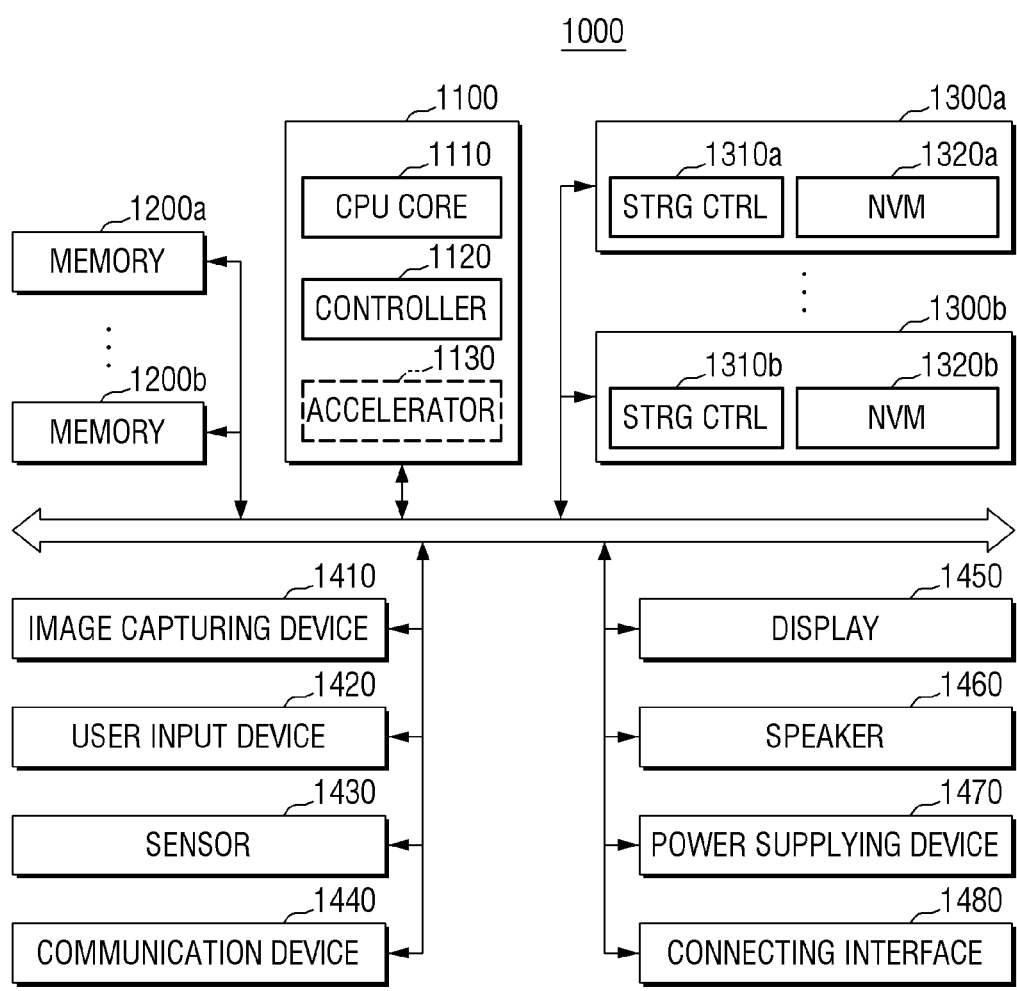
FIG. 27 is a diagram illustrating a system to which a memory device according to embodiments of the present disclosure is applied.

FIG. 27 is a diagram illustrating a system to which a memory device according to embodiments of the present disclosure is applied.

A system 1000 of FIG. 27 may be a mobile system such as, for example, a portable communication terminal (e.g., mobile phone), a smartphone, a tablet personal computer, a wearable device, a healthcare device, an Internet of Things (IoT) device, etc. However, the system 1000 of FIG. 27 is not necessarily limited to a mobile system, and may also be, for example, a personal computer, a laptop computer, a server, a media player, an automotive device such as a navigation system, etc.

Referring to FIG. 27, the system 1000 may include a main processor 1100, memories 1200a and 1200b, and storage devices 1300a and 1300b, and additionally, may include one or more of an image capturing device 1410, a user input device 1420, a sensor 1430, a communication device 1440, a display 1450, a speaker 1460, a power supply device 1470, and a connection interface 1480.

The main processor 1100 may control the overall operation of the system 1000 including, for example, the operations of other components constituting the system 1000. The main processor 1100 may be implemented as, for example, a general-purpose processor, a dedicated processor, an application processor, etc.

The main processor 1100 may include one or more CPU cores 1110, and may further include a controller 1120 for controlling the memories 1200a and 1200b and/or the storage devices 1300a and 1300b. According to an embodiment, the main processor 1100 may further include an accelerator 1130, which is a dedicated circuit for high-speed data operation such as artificial intelligence (AI) data operation. The accelerator 1130 may include, for example, a graphics processing unit (GPU), a neural processing unit (NPU), a data processing unit (DPU), etc., and may be implemented as a separate chip physically independent of other components of the main processor 1100.

The memories 1200a and 1200b may be used as main memory devices of the system 1000, and may include a volatile memory such as, for example, SRAM and/or DRAM, or may include a nonvolatile memory such as, for example, a flash memory, PRAM and/or RRAM. The memories 1200a and 1200b may be implemented in the same package as the main processor 1100.

The storage devices 1300a and 1300b may function as nonvolatile storage devices that store data regardless of whether power is supplied, and may have a relatively larger storage capacity than the memories 1200a and 1200b. The storage devices 1300a and 1300b may include storage controllers 1310a and 1310b and non-volatile memories (NVM) 1320a and 1320b for storing data under the control of the storage controllers 1310a and 1310b. The non-volatile memories 1320a and 1320b may also include a flash memory having a 2-dimensional (2D) structure or a 3-dimensional (3D) vertical NAND (V-NAND) structure, as well as other types of non-volatile memory such as, for example, PRAM and/or RRAM.

The storage devices 1300a and 1300b may be included in the system 1000 in a state physically separated from the main processor 1100, or may be implemented in the same package as the main processor 1100. In addition, the storage devices 1300a and 1300b may have the same shape as a solid state device (SSD) or a memory card, and thus, may be coupled in a detachable and attachable manner to other components of the system 1000 through an interface such as the connection interface 1480 to be described later. Such storage devices 1300a and 1300b may be devices to which standard conventions such as, for example, universal flash storage (UFS), embedded multi-media card (eMMC), or non-volatile memory express (NVMe) are applied, but are not necessarily limited thereto.

The image capturing device 1410 may take a still image or a moving picture, and may be, for example, a camera, a camcorder, a webcam, etc.

The user input device 1420 may receive various types of data inputted from a user of the system 1000, and may be, for example, a touch pad, a keypad, a keyboard, a mouse, a microphone, etc.

The sensor 1430 may sense various types of physical quantities that can be obtained from outside of the system 1000 and may convert the sensed physical quantities into electric signals. The sensor 1430 may be, for example, a temperature sensor, a pressure sensor, an illuminance sensor, a position sensor, an acceleration sensor, a biosensor, a gyroscope sensor, etc.

The communication device 1440 may transmit and receive signals to and from other devices outside the system 1000 according to various communication protocols. The communication device 1440 may be implemented by including, for example, an antenna, a transceiver, a modem (MODEM), etc.

The display 1450 and the speaker 1460 may function as output devices that output visual information and auditory information to the user of the system 1000, respectively.

The power supply device 1470 may appropriately convert power supplied from a battery built into the system 1000 and/or an external power source to supply the power to each component of the system 1000.

The connection interface 1480 may provide a connection between the system 1000 and an external device connected to the system 1000 and capable of exchanging data with the system 1000. The connection interface 1480 may be implemented as various types of interfaces, such as, for example, advanced technology attachment (ATA), serial ATA (SATA), external SATA (e-SATA), small computer small interface (SCSI), serial attached SCSI (SAS), peripheral component interconnection (PCI), PCI express (PCIe), NVM express (NVMe), IEEE 1394, universal serial bus (USB), secure digital (SD) card, multi-media card (MMC), embedded multi-media card (eMMC), universal flash storage (UFS), embedded universal flash storage (eUFS), and compact flash (CF) card.

In some embodiments, the aforementioned memory device 100 of FIG. 1 may correspond to, for example, the memories 1200a and 1200b, and the host device 200 of FIG. 1 may correspond to, for example, the main processor 1100. In some embodiments, the aforementioned memory device 100 of FIG. 1 may correspond to, for example, the storage devices 1300a and 1300b, and the host device 200 of FIG. 1 may correspond to, for example, the main processor 1100.

In some embodiments, the above-described data transmitting device 600 of FIG. 25 may correspond to at least one of the image capturing device 1410, the user input device 1420, the sensor 1430, or the communication device 1440, and the data receiving device 700 of FIG. 25 may correspond to at least one of the display 1450 or the speaker 1460.

As is traditional in the field of the present disclosure, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

In embodiments of the present disclosure, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. In an embodiment of the present disclosure, the 3D memory array includes vertical NAND strings that are vertically oriented such that at least one memory cell is located over another memory cell. The at least one memory cell may include a charge trap layer. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

While the present disclosure has been particularly shown and described with reference to embodiments thereof, it will be understood by those of ordinary skill in the art that various changes in form and detail may be made therein without departing from the spirit and scope of the present disclosure as defined by the following claims.

What is claimed is:

1. A memory device, comprising:
   a data signal generator configured to generate a data signal;
   a transmission driver configured to receive the data signal and output a multi-level signal having any one of a first signal level, a second signal level, and a third signal level based on the data signal;
   a command decoder configured to receive a feedback signal from outside of the memory device and decode the feedback signal;
   a data signal controller configured to adjust the data signal based on a decoding result of the command decoder; and
   a drive strength controller configured to adjust at least one of the first to third signal levels based on the decoding result of the command decoder,
   wherein the data signal is one of a first data signal and a second data signal,
   the transmission driver comprises a pull-up circuit that receives the first data signal and a pull-down circuit that receives the second data signal, and
   the drive strength controller adjusts at least one of the first to third signal levels by adjusting an on-resistance of the pull-up circuit and the pull-down circuit.

2. The memory device of claim 1, wherein the data signal controller adjusts a slope of the data signal based on the decoding result of the command decoder.

3. The memory device of claim 1, wherein the data signal controller adjusts a duty ratio of the data signal based on the decoding result of the command decoder.

4. The memory device of claim 1, wherein the data signal controller adjusts a delay amount of the data signal based on the decoding result of the command decoder.

5. The memory device of claim 1, wherein the pull-up circuit comprises
   a first pull-up circuit comprises a plurality of first pull-up units enabled based on a first pull-up enable code,
   a second pull-up circuit comprises a plurality of second pull-up units enabled based on a second pull-up enable code different from the first pull-up enable code, and
   the pull-down circuit comprises,
   a first pull-down circuit comprises a plurality of first pull-down units enabled based on a first pull-down enable code, and
   a second pull-down circuit comprises a plurality of second pull-down units enabled based on a second pull-down enable code different from the first pull-down enable code.

6. The memory device of claim 5, wherein the drive strength controller adjusts at least one of the first to third signal levels by adjusting at least one of the first and second pull-up enable codes and the first and second pull-down enable codes.

7. The memory device of claim 5, wherein
the pull-up circuit further comprises a third pull-up circuit comprising a plurality of third pull-up units enabled based on a third pull-up enable code different from the first and second pull-up enable codes, and
the pull-down circuit further comprises a third pull-down circuit comprising a plurality of third pull-down units enabled based on a third pull-down enable code different from the first and second pull-down enable codes.

8. The memory device of claim 7, wherein the drive strength controller adjusts at least one of the first to third signal levels by adjusting at least one of the first to third pull-up enable codes and the first to third pull-down enable codes.

9. The memory device of claim 1, wherein the feedback signal comprises at least one of a first command instructing adjustment of the data signal or a second command instructing adjustment of at least one of the first to third signal levels.

10. A memory device, comprising:
a transmission driver configured to output a first multi-level signal having any one of a first signal level, a second signal level, a third signal level, and a fourth signal level based on a data signal; and
a controller configured to receive a feedback signal from outside of the memory device and control the transmission driver to output a second multi-level signal different from the first multi-level signal based on the feedback signal,
wherein the controller adjusts the data signal, and controls the transmission driver to output the second multi-level signal by adjusting at least one of the first to fourth signal levels,
wherein the data signal is one of a first data signal and a second data signal,
the transmission driver comprises a pull-up circuit that receives the first data signal and a pull-down circuit that receives the second data signal, and
the controller adjusts at least one of the first to fourth signal levels by adjusting an on-resistance of the pull-up circuit and the pull-down circuit.

11. The memory device of claim 10, wherein the feedback signal comprises a first command instructing adjustment of the data signal and a second command instructing adjustment of at least one of the first to fourth signal levels.

12. The memory device of claim 10, wherein the controller adjusts at least one of a slope, a duty ratio, or a delay amount of at least one of the first data signal or the second data signal.

13. The memory device of claim 10, wherein the pull-up circuit comprises
a first pull-up circuit is enabled based on a first pull-up enable code,
a second pull-up circuit is enabled based on a second pull-up enable code different from the first pull-up enable code,
a third pull-up circuit is enabled based on a third pull-up enable code different from the first and second pull-up enable codes, and the pull-down circuit comprises
a first pull-down circuit is enabled based on a first pull-down enable code,
a second pull-down circuit is enabled based on a second pull-down enable code different from the first pull-down enable code,
a third pull-down circuit is enabled based on a third pull-down enable code different from the first and second pull-down enable codes, and
the controller adjusts at least one of the first to fourth signal levels by adjusting at least one of the first to third pull-up enable codes and the first to third pull-down enable codes.

14. The memory device of claim 13, wherein in response to the first to third pull-up circuits being enabled, and the first to third pull-down circuits being disabled, the first multi-level signal output by the transmission driver has the first signal level,
in response to the second and third pull-up circuits and the third pull-down circuit being enabled, and the first pull-up circuit and the first and second pull-down circuits being disabled, the first multi-level signal output by the transmission driver has the second signal level,
in response to the third pull-up circuit, the second and third pull-down circuits being enabled, and the first and second pull-up circuits and the first pull-down circuit being disabled, the first multi-level signal output by the transmission driver has the third signal level, and
in response to the first to third pull-down circuits being enabled, and the first to third pull-up circuits being disabled, the first multi-level signal output by the transmission driver has the fourth signal level.

15. A host device, comprising:
a reception driver configured to receive a first multi-level signal generated based on a first data signal and having any one of a first signal level, a second signal level, and a third signal level; and
a signal controller configured to check the first multi-level signal received by the reception driver, and generate and output a feedback signal comprising a first command instructing adjustment of the first data signal and a second command instructing adjustment of at least one of the first to third signal levels,
wherein the first data signal is transmitted to at least one of a pull-up circuit and a pull-down circuit and used for adjusting at least one of the first to third signal levels.

16. The host device of claim 15, wherein the signal controller generates the feedback signal by checking a timing skew of the first multi-level signal received by the reception driver.

17. The host device of claim 16, wherein the signal controller comprises an eye open monitor that checks the timing skew of the first multi-level signal received by the reception driver.

18. The host device of claim 16, wherein after the signal controller outputs the feedback signal, the reception driver receives a second multi-level signal generated based on a second data signal obtained by adjusting the first data signal, and having the timing skew adjusted.

* * * * *